(12) United States Patent
Tang et al.

(10) Patent No.: US 7,746,704 B1
(45) Date of Patent: Jun. 29, 2010

(54) PROGRAM-AND-ERASE METHOD FOR MULTILEVEL NONVOLATILE MEMORY

(75) Inventors: Qiang Tang, Cupertino, CA (US); Bo Wang, Sunnyvale, CA (US); Chih-Hsin Wang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 117 days.

(21) Appl. No.: 12/209,794

(22) Filed: Sep. 12, 2008

Related U.S. Application Data

(60) Provisional application No. 60/974,318, filed on Sep. 21, 2007.

(51) Int. Cl.
*G11C 16/04* (2006.01)
(52) U.S. Cl. .................. 365/185.28; 365/185.03; 365/185.18
(58) Field of Classification Search ............. 365/185.28
See application file for complete search history.

(56) References Cited

U.S. PATENT DOCUMENTS

| | | | | |
|---|---|---|---|---|
| 6,879,520 B2 * | 4/2005 | Hosono et al. | ......... | 365/185.17 |
| 7,518,920 B2 * | 4/2009 | Kang | ..................... | 365/185.17 |
| 7,596,021 B2 * | 9/2009 | Choi et al. | ............. | 365/185.03 |
| 7,633,802 B2 * | 12/2009 | Mokhlesi | ............... | 365/185.18 |
| 2005/0157552 A1 * | 7/2005 | Hemink et al. | ......... | 365/185.03 |
| 2007/0081388 A1 * | 4/2007 | Joo | ........................ | 365/185.19 |
| 2009/0180317 A1 * | 7/2009 | Kang et al. | .............. | 365/185.2 |

OTHER PUBLICATIONS

U.S. Appl. No. 11/169,399; "Method and Apparatus Transporting Charges in Semiconductor Device and Semiconductor Memory Device"; Chih-Hsin Wang; filed Jun. 28, 2005; 89 pages.

* cited by examiner

*Primary Examiner*—Son L Mai

(57) ABSTRACT

A system includes an input that receives a control signal and a program module that initializes a nonvolatile multilevel memory cell based on the control signal. The program module initializes the nonvolatile multilevel memory cell by programming the nonvolatile multilevel memory cell to one of S states of the nonvolatile multilevel memory cell, where S is an integer greater than 1. The one of the S states is different than a lowest one of the S states.

44 Claims, 19 Drawing Sheets

PROGRAM-AND-ERASE METHOD FOR MULTILEVEL NONVOLATILE MEMORY

CROSS-REFERENCE TO RELATED APPLICATIONS

This application claims the benefit of U.S. Provisional Application No. 60/974,318, filed on Sep. 21, 2007. The disclosure of the above application is incorporated herein by reference in its entirety.

FIELD

The present disclosure relates to semiconductor memory, and more particularly to systems and methods for programming and erasing multilevel memory cells of nonvolatile semiconductor memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays may include memory cells of nonvolatile memory such as flash memory, phase-change memory, etc. The memory cells of nonvolatile memory may be electrically programmable and erasable. In the memory arrays, the memory cells are typically arranged in rows and columns. The memory cells in the rows and columns are addressed by word lines (WLs) and bit lines (BLs), respectively. The memory arrays comprise WL and BL decoders that select appropriate WLs and BLs, respectively, depending on the addresses of the memory cells selected during read/write operations.

SUMMARY

A system comprises an input that receives a control signal and a program module that initializes a nonvolatile multilevel memory cell based on the control signal. The program module initializes the nonvolatile multilevel memory cell by programming the nonvolatile multilevel memory cell to one of S states of the nonvolatile multilevel memory cell, where S is an integer greater than 1. The one of the S states is different than a lowest one of the S states.

In another feature, the one of the S states includes a highest one of the S states.

In other features, the S states are based on S threshold values of the nonvolatile multilevel memory cell, respectively. The lowest one of the S states corresponds to one of the S threshold values that has a lowest absolute value.

In another feature, the S threshold values include one of S threshold voltages and S threshold currents.

In another feature, the nonvolatile multilevel memory cell is in an off state when programmed to the one of the S states.

In another feature, the system further comprises a verification module that verifies that the nonvolatile multilevel memory cell is programmed to the one of the S states.

In another feature, a first absolute value of a first threshold voltage of the nonvolatile multilevel memory cell corresponding to the one of the S states is greater than a second absolute value of a second threshold voltage of the nonvolatile multilevel memory cell corresponding to the lowest one of the S states. The first absolute value is less than or equal to a third absolute value of a third threshold voltage of the nonvolatile multilevel memory cell corresponding to a highest one of the S states.

In another feature, the program module programs the nonvolatile multilevel memory cell with user data by adjusting a threshold voltage of the nonvolatile multilevel memory cell. The program module increases an absolute value of the threshold voltage.

In another feature, the system further comprises an erase module that erases the nonvolatile multilevel memory cell by adjusting a threshold voltage of the nonvolatile multilevel memory cell to store user data. The erase module decreases an absolute value of the threshold voltage.

In another feature, the program module writes user data in the nonvolatile multilevel memory cell by programming the nonvolatile multilevel memory cell when the one of the S states excludes a highest one of the S states.

In another feature, the system further comprises an ease module for writing user data in the nonvolatile multilevel memory cell by erasing the nonvolatile multilevel memory cell when the one of the S states includes a highest one of the S states.

In another feature, the program module initializes the nonvolatile multilevel memory cell using one of channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, and tunneling ballistic-electron injection.

In another feature, the erase module erases the nonvolatile multilevel memory cell using one of Band-to-Band tunneling (BTBT) induced hot-hole injection, tunneling ballistic-hole injection, and Fowler-Nordheim (FN) tunneling.

In other features, the nonvolatile multilevel memory cell includes a flash memory cell having a source, a drain, a floating gate, and one of an n-channel and a p-channel. The floating gate includes one of a poly-silicon conductor, a trapping dielectric, and nanocrystals. The trapping dielectric comprises one of a nitride layer, hafnium oxide ($HfO_2$), and zirconium oxide ($ZrO_2$). The nanocrystals comprise oval-shaped silicon nanocrystals having a diameter between 2 nm and 7 nm. The nanocrystals comprise one of germanium (Ge), hafnium oxide ($HfO_2$), and a silicon-germanium (Si—Ge) alloy.

In another feature, the nonvolatile multilevel memory cell comprises a gate-controlled resistance.

In other features, the nonvolatile multilevel memory cell comprises an electrically alterable resistance that communicates with a current limiting device. The electrically alterable resistance comprises one of a phase change material and a bridging conductor. The current limiting device includes one of a diode and a transistor.

In other features, a memory integrated circuit (IC) comprises the system and further comprises a memory array that includes an array of the nonvolatile multilevel memory cells. The memory array includes word lines and bit lines that communicate with the nonvolatile multilevel memory cells. The program module programs a block of the nonvolatile multilevel memory cells in a memory block using a block-level program operation. The memory block includes a plurality of the word lines and the bit lines corresponding to a plurality of pages. One of the pages includes a plurality of the nonvolatile multilevel memory cells on one of the word lines.

In another feature, the memory IC further comprises a verification module that uses a block-level verify operation to verify that the nonvolatile multilevel memory cells of the memory block are programmed to the one of the S states.

In another feature, the memory IC further comprises an erase module that erases the nonvolatile multilevel memory cells of the memory block using a page-level erase operation.

In another feature, the memory array includes a resistive cross-point array.

In other features, a solid-state drive (SSD) comprises the memory IC. A data storage system comprises a storage area network (SAN) control module that controls a plurality of storage units each comprising a plurality of the SSD.

In still other features, a method comprises receiving a control signal and initializing a nonvolatile multilevel memory cell based on the control signal by programming the nonvolatile multilevel memory cell to one of S states of the nonvolatile multilevel memory cell, where S is an integer greater than 1. The one of the S states is different than a lowest one of the S states.

In another feature, the method further comprises initializing the nonvolatile multilevel memory cell by programming the nonvolatile multilevel memory cell to a highest one of the S states.

In other features, the method further comprises determining the S states based on S threshold values of the nonvolatile multilevel memory cell, respectively, and selecting one of the S threshold values having a lowest absolute value as the lowest one of the S states. The S threshold values include one of S threshold voltages and S threshold currents.

In other features, the method further comprises verifying that the nonvolatile multilevel memory cell is programmed to the one of the S states. The nonvolatile multilevel memory cell is in an off state when programmed to the one of the S states.

In another feature, the method further comprises initializing the nonvolatile multilevel memory cell by selecting a first absolute value of a first threshold voltage corresponding to the one of the S states greater than a second absolute value of a second threshold voltage corresponding to the lowest one of the S states and less than or equal to a third absolute value of a third threshold voltage corresponding to a highest one of the S states.

In another feature, the method further comprises programming the nonvolatile multilevel memory cell with user data by increasing an absolute value of a threshold voltage of the nonvolatile multilevel memory cell.

In another feature, the method further comprises erasing the nonvolatile multilevel memory cell by decreasing an absolute value of a threshold voltage of the nonvolatile multilevel memory cell to store user data.

In another feature, the method further comprises writing user data in the nonvolatile multilevel memory cell by programming the nonvolatile multilevel memory cell when the one of the S states excludes a highest one of the S states and by erasing the nonvolatile multilevel memory cell when the one of the S states includes a highest one of the S states.

In another feature, the method further comprises initializing the nonvolatile multilevel memory cell using one of channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, and tunneling ballistic-electron injection.

In another feature, the method further comprises erasing the nonvolatile multilevel memory cell using one of Band-to-Band tunneling (BTBT) induced hot-hole injection, tunneling ballistic-hole injection, and Fowler-Nordheim (FN) tunneling.

In other features, the method further comprises configuring a plurality of the nonvolatile multilevel memory cells in a memory array, programming a block of the nonvolatile multilevel memory cells in a memory block using a block-level program operation, and verifying that the nonvolatile multilevel memory cells of the memory block are programmed to the one of the S states using a block-level verify operation.

In another feature, the method further comprises erasing the nonvolatile multilevel memory cells of the memory block using a page-level erase operation.

In still other features, a system comprises input means for receiving a control signal and programming means for initializing a nonvolatile multilevel memory cell based on the control signal. The programming means initializes the nonvolatile multilevel memory cell by programming the nonvolatile multilevel memory cell to one of S states of the nonvolatile multilevel memory cell, where S is an integer greater than 1. The one of the S states is different than a lowest one of the S states.

In another feature, the one of the S states includes a highest one of the S states.

In other features, the S states are based on S threshold values of the nonvolatile multilevel memory cell, respectively. The lowest one of the S states corresponds to one of the S threshold values that has a lowest absolute value.

In another feature, the S threshold values include one of S threshold voltages and S threshold currents.

In another feature, the nonvolatile multilevel memory cell is in an off state when programmed to the one of the S states.

In another feature, the system further comprises verifying means for verifying that the nonvolatile multilevel memory cell is programmed to the one of the S states.

In another feature, a first absolute value of a first threshold voltage of the nonvolatile multilevel memory cell corresponding to the one of the S states is greater than a second absolute value of a second threshold voltage of the nonvolatile multilevel memory cell corresponding to the lowest one of the S states. The first absolute value is less than or equal to a third absolute value of a third threshold voltage of the nonvolatile multilevel memory cell corresponding to a highest one of the S states.

In another feature, the programming means programs the nonvolatile multilevel memory cell with user data by adjusting a threshold voltage of the nonvolatile multilevel memory cell. The programming means increases an absolute value of the threshold voltage.

In another feature, the system further comprises erasing means for erasing the nonvolatile multilevel memory cell by adjusting a threshold voltage of the nonvolatile multilevel memory cell to store user data. The erasing means decreases an absolute value of the threshold voltage.

In another feature, the programming means writes user data in the nonvolatile multilevel memory cell by programming the nonvolatile multilevel memory cell when the one of the S states excludes a highest one of the S states.

In another feature, the system further comprises erasing means for writing user data in the nonvolatile multilevel memory cell by erasing the nonvolatile multilevel memory cell when the one of the S states includes a highest one of the S states.

In another feature, the programming means initializes the nonvolatile multilevel memory cell using one of channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, and tunneling ballistic-electron injection.

In another feature, the erasing means erases the nonvolatile multilevel memory cell using one of Band-to-Band tunneling (BTBT) induced hot-hole injection, tunneling ballistic-hole injection, and Fowler-Nordheim (FN) tunneling.

In other features, the nonvolatile multilevel memory cell includes a flash memory cell having a source, a drain, a floating gate, and one of an n-channel and a p-channel. The floating gate includes one of a poly-silicon conductor, a trapping dielectric, and nanocrystals. The trapping dielectric comprises one of a nitride layer, hafnium oxide ($HfO_2$), and zirconium oxide ($ZrO_2$). The nanocrystals comprise oval-shaped silicon nanocrystals having a diameter between 2 nm and 7 nm. The nanocrystals comprise one of germanium (Ge), hafnium oxide ($HfO_2$), and a silicon-germanium (Si—Ge) alloy.

In another feature, the nonvolatile multilevel memory cell comprises a gate-controlled resistance.

In other features, the nonvolatile multilevel memory cell comprises an electrically alterable resistance that communicates with a current limiting device. The electrically alterable resistance comprises one of a phase change material and a bridging conductor. The current limiting device includes one of a diode and a transistor.

In other features, a memory integrated circuit (IC) comprises the system and further comprises a memory array that includes an array of the nonvolatile multilevel memory cells. The memory array includes word lines and bit lines that communicate with the nonvolatile multilevel memory cells. The programming means programs a block of the nonvolatile multilevel memory cells in a memory block using a block-level program operation. The memory block includes a plurality of the word lines and the bit lines corresponding to a plurality of pages. One of the pages includes a plurality of the nonvolatile multilevel memory cells on one of the word lines.

In another feature, the memory IC further comprises verifying means for verifying using a block-level verify operation that the nonvolatile multilevel memory cells of the memory block are programmed to the one of the S states.

In another feature, the memory IC further comprises erasing for erasing the nonvolatile multilevel memory cells of the memory block using a page-level erase operation.

In another feature, the memory array includes a resistive cross-point array.

In other features, a solid-state drive (SSD) comprises the memory IC. A data storage system comprises a storage area network (SAN) control means for controlling a SAN. The SAN control means controls a plurality of storage units each comprising a plurality of the SSD.

In still other features, a computer program stored on a computer-readable medium generating instructions executed by a processor comprises receiving a control signal and initializing a nonvolatile multilevel memory cell based on the control signal by programming the nonvolatile multilevel memory cell to one of S states of the nonvolatile multilevel memory cell, where S is an integer greater than 1. The one of the S states is different than a lowest one of the S states.

In another feature, the computer program further comprises initializing the nonvolatile multilevel memory cell by programming the nonvolatile multilevel memory cell to a highest one of the S states.

In other features, the computer program further comprises determining the S states based on S threshold values of the nonvolatile multilevel memory cell, respectively, and selecting one of the S threshold values having a lowest absolute value as the lowest one of the S states. The S threshold values include one of S threshold voltages and S threshold currents.

In other features, the computer program further comprises verifying that the nonvolatile multilevel memory cell is programmed to the one of the S states. The nonvolatile multilevel memory cell is in an off state when programmed to the one of the S states.

In another feature, the computer program further comprises initializing the nonvolatile multilevel memory cell by selecting a first absolute value of a first threshold voltage corresponding to the one of the S states greater than a second absolute value of a second threshold voltage corresponding to the lowest one of the S states and less than or equal to a third absolute value of a third threshold voltage corresponding to a highest one of the S states.

In another feature, the computer program further comprises programming the nonvolatile multilevel memory cell with user data by increasing an absolute value of a threshold voltage of the nonvolatile multilevel memory cell.

In another feature, the computer program further comprises erasing the nonvolatile multilevel memory cell by decreasing an absolute value of a threshold voltage of the nonvolatile multilevel memory cell to store user data.

In another feature, the computer program further comprises writing user data in the nonvolatile multilevel memory cell by programming the nonvolatile multilevel memory cell when the one of the S states excludes a highest one of the S states and by erasing the nonvolatile multilevel memory cell when the one of the S states includes a highest one of the S states.

In another feature, the computer program further comprises initializing the nonvolatile multilevel memory cell using one of channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, and tunneling ballistic-electron injection.

In another feature, the computer program further comprises erasing the nonvolatile multilevel memory cell using one of Band-to-Band tunneling (BTBT) induced hot-hole injection, tunneling ballistic-hole injection, and Fowler-Nordheim (FN) tunneling.

In other features, the computer program further comprises configuring a plurality of the nonvolatile multilevel memory cells in a memory array, programming a block of the nonvolatile multilevel memory cells in a memory block using a block-level program operation, and verifying that the nonvolatile multilevel memory cells of the memory block are programmed to the one of the S states using a block-level verify operation.

In another feature, the computer program further comprises erasing the nonvolatile multilevel memory cells of the memory block using a page-level erase operation.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1A:
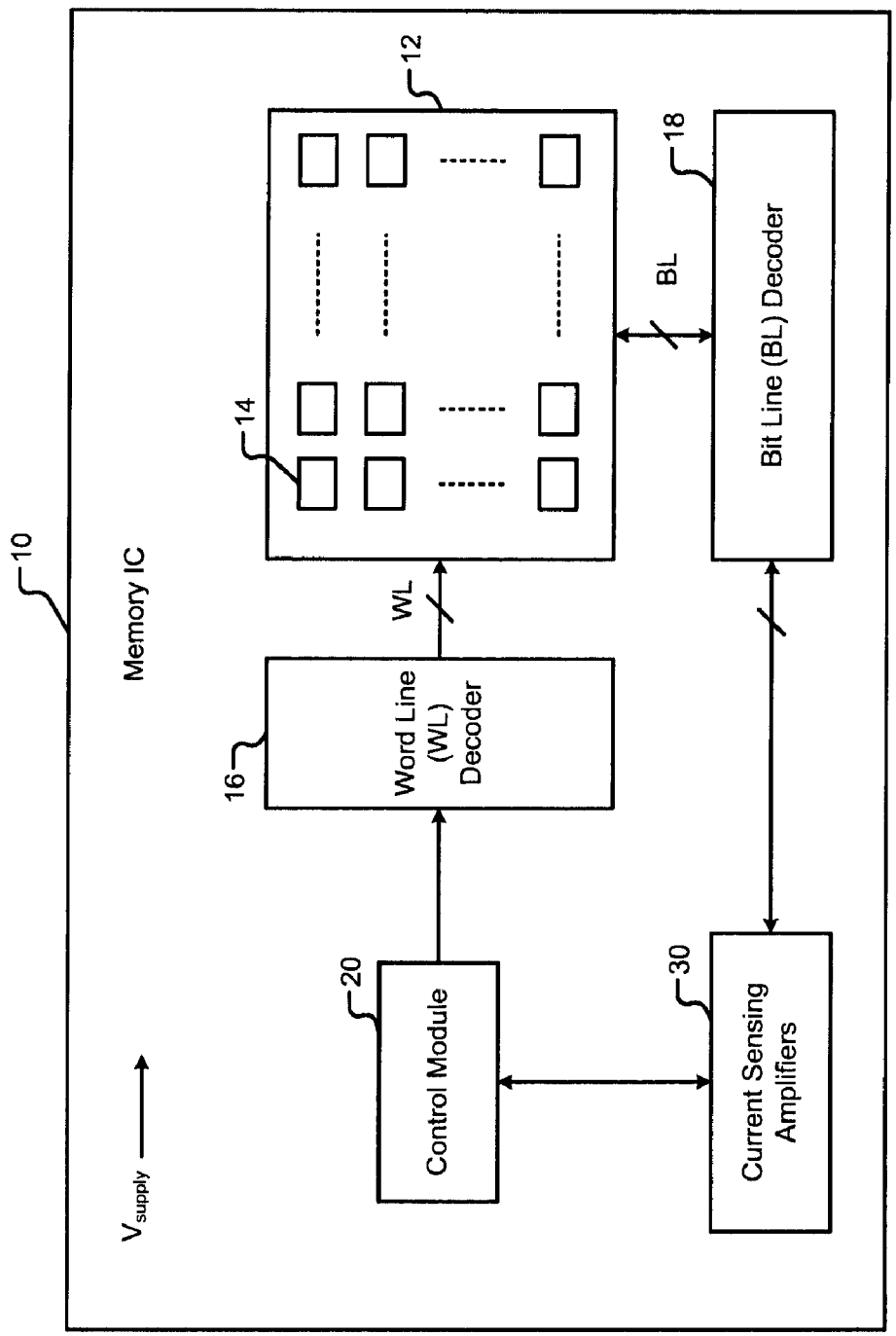
FIG. 1A is a functional block diagram of a memory integrated circuit (IC)

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 1B:
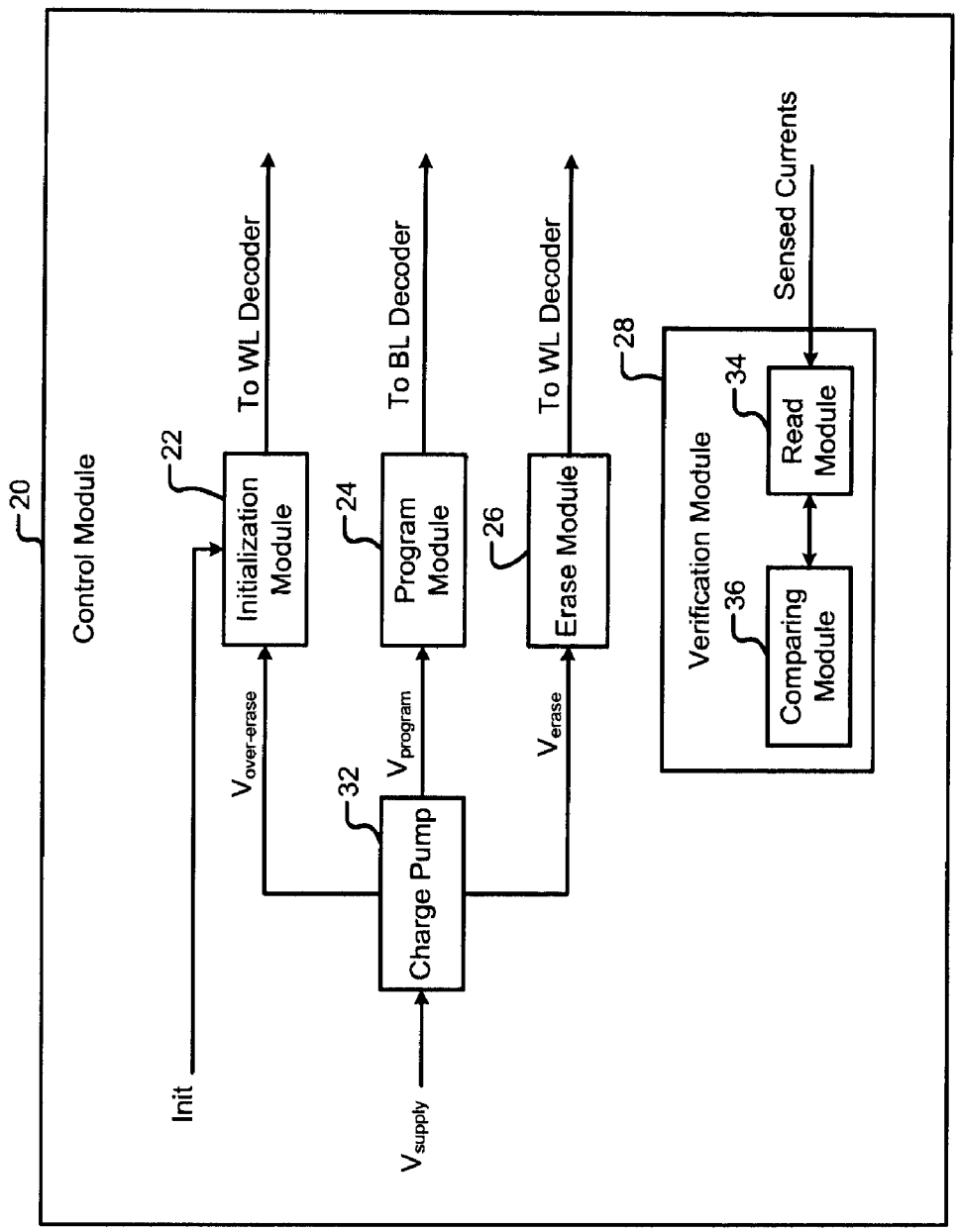
FIG. 1B is a functional block diagram of a control module of the memory IC of FIG. 1A.
Figure 2:
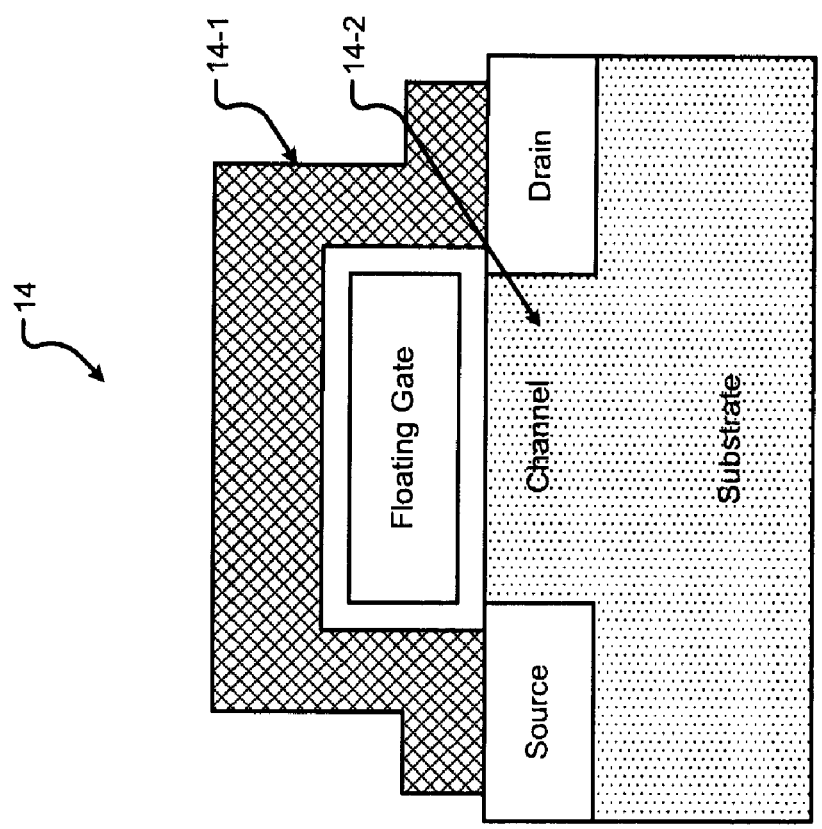
FIG. 2 is a schematic of a multilevel nonvolatile memory cell.
Figure 3:
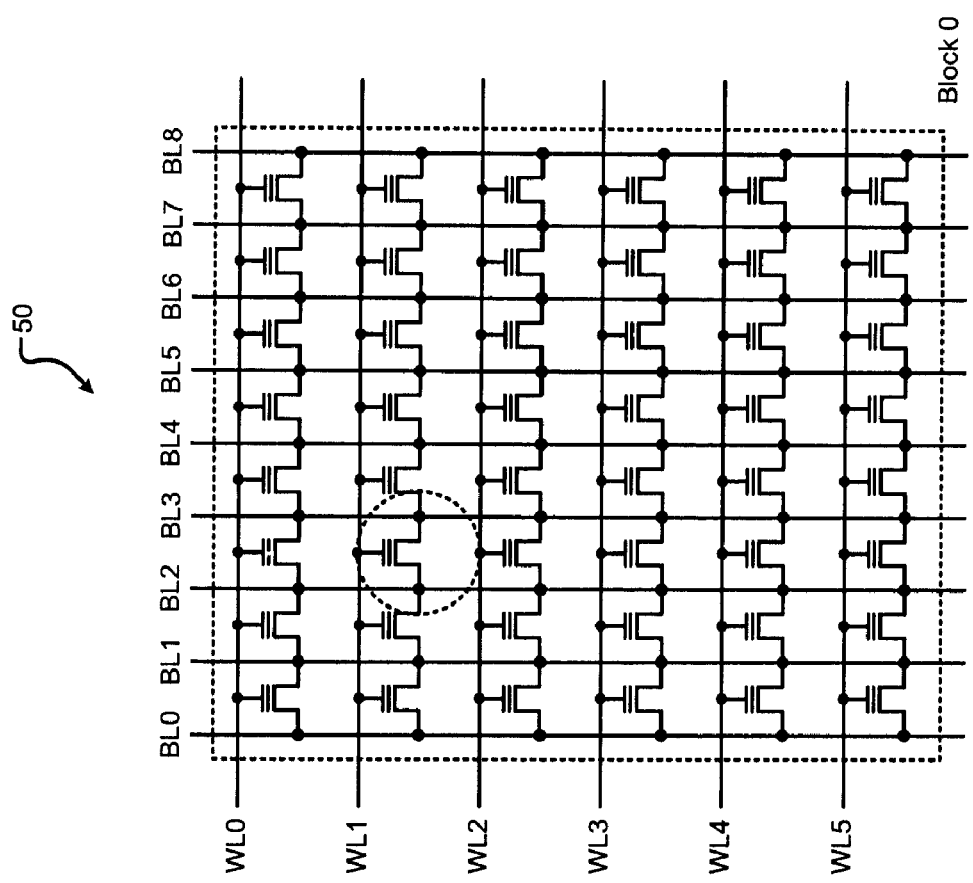
FIG. 3 is a schematic of a NOR type memory array.
Figure 4:
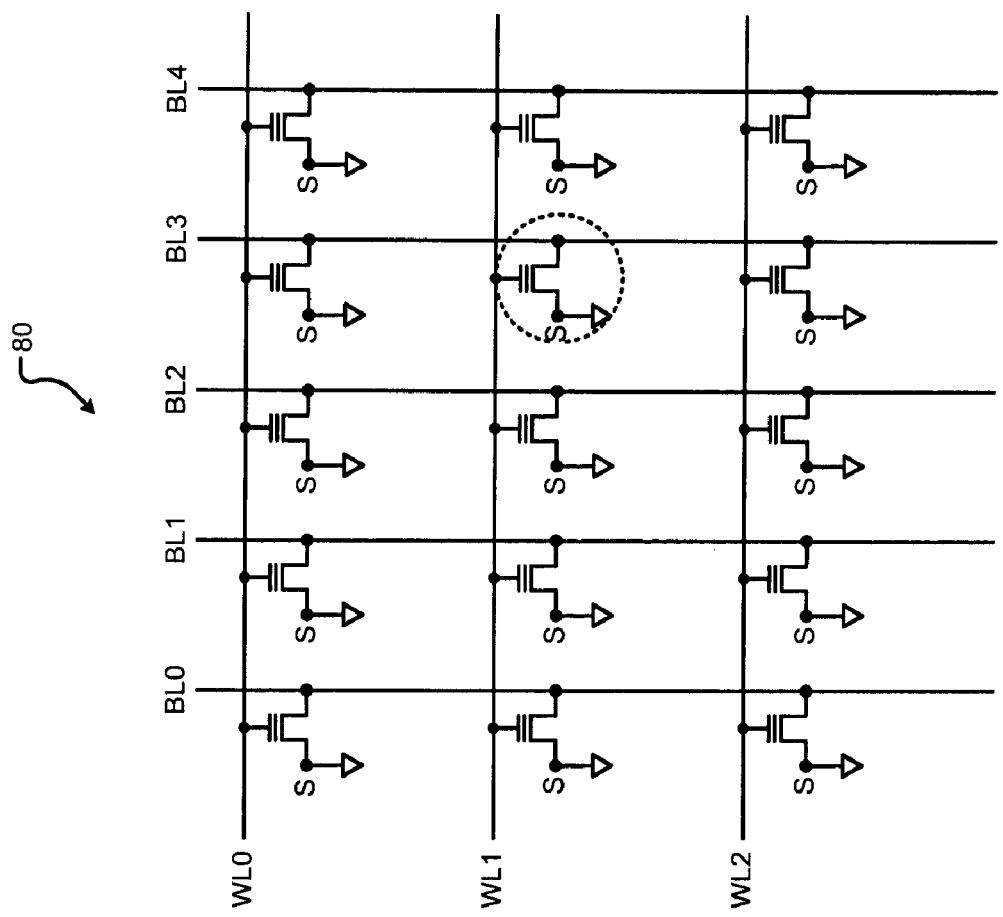
FIG. 4 is a schematic of a NOR type memory array.

The present disclosure is organized as follows. Operation of an exemplary memory integrated circuit (IC) is discussed in conjunction with FIGS. 1A and 1B. Operation of an exemplary multilevel nonvolatile memory cell used in the memory IC of FIG. 1 is discussed in conjunction with FIG. 2. Exemplary memory arrays comprising the memory cell of FIG. 2 are shown in FIGS. 3 and 4. A three-step method used by the memory IC of FIG. 1 for operating the memory arrays of FIGS. 3 and 4 is discussed in conjunction with FIG. 5.

Figure 6A:
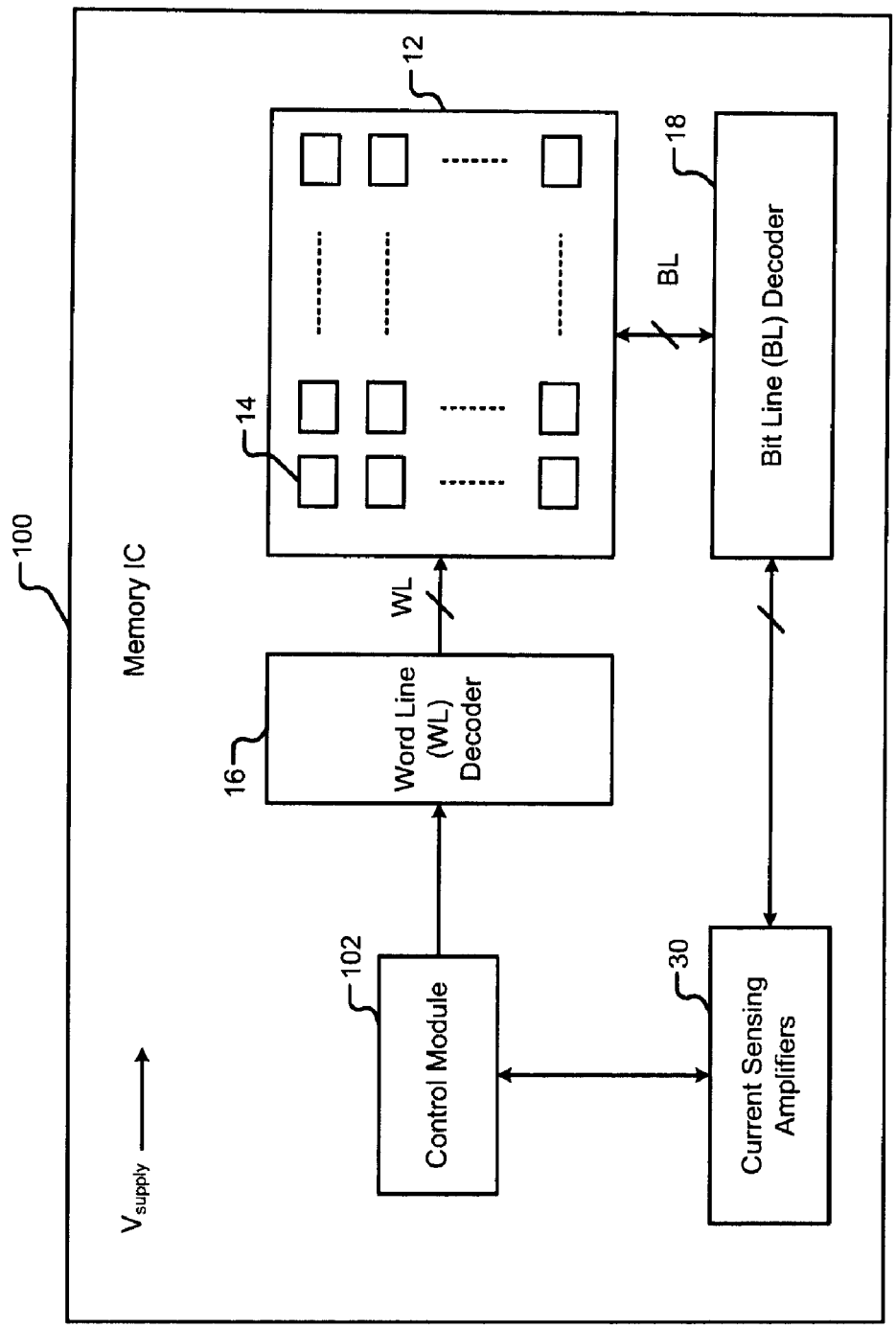
FIG. 6A is a functional block diagram of a memory IC.
Figure 6B:
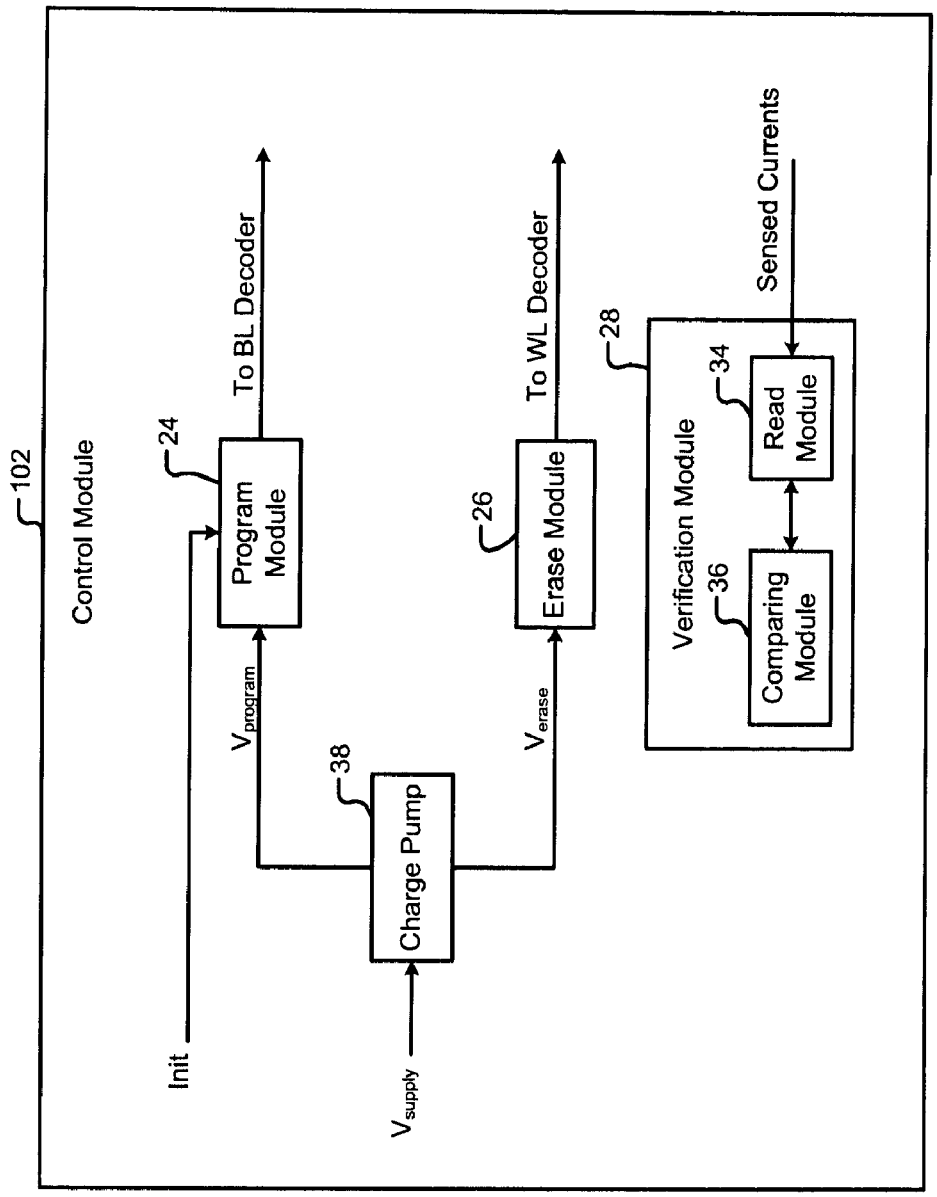
FIG. 6B is a functional block diagram of a control module of the memory IC of FIG. 6A.
Figure 8:
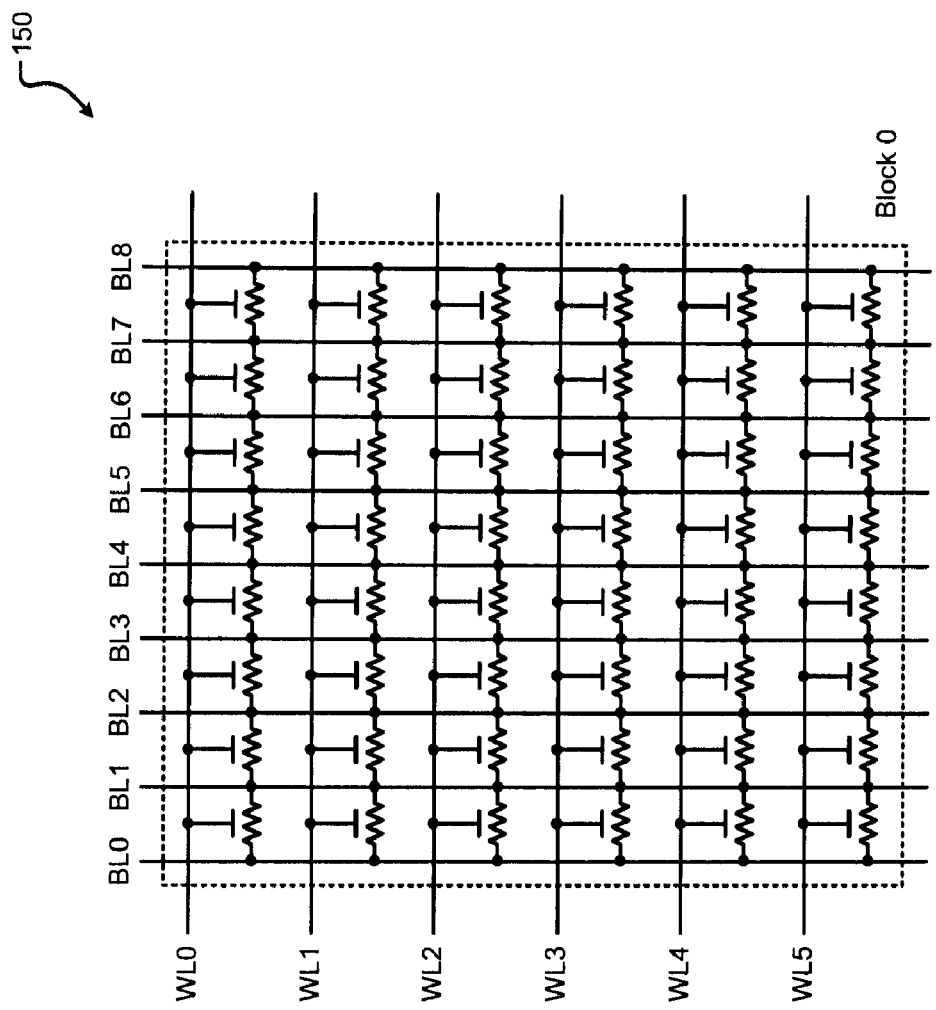
FIG. 8 is schematic a NOR type memory array.
Figure 9:
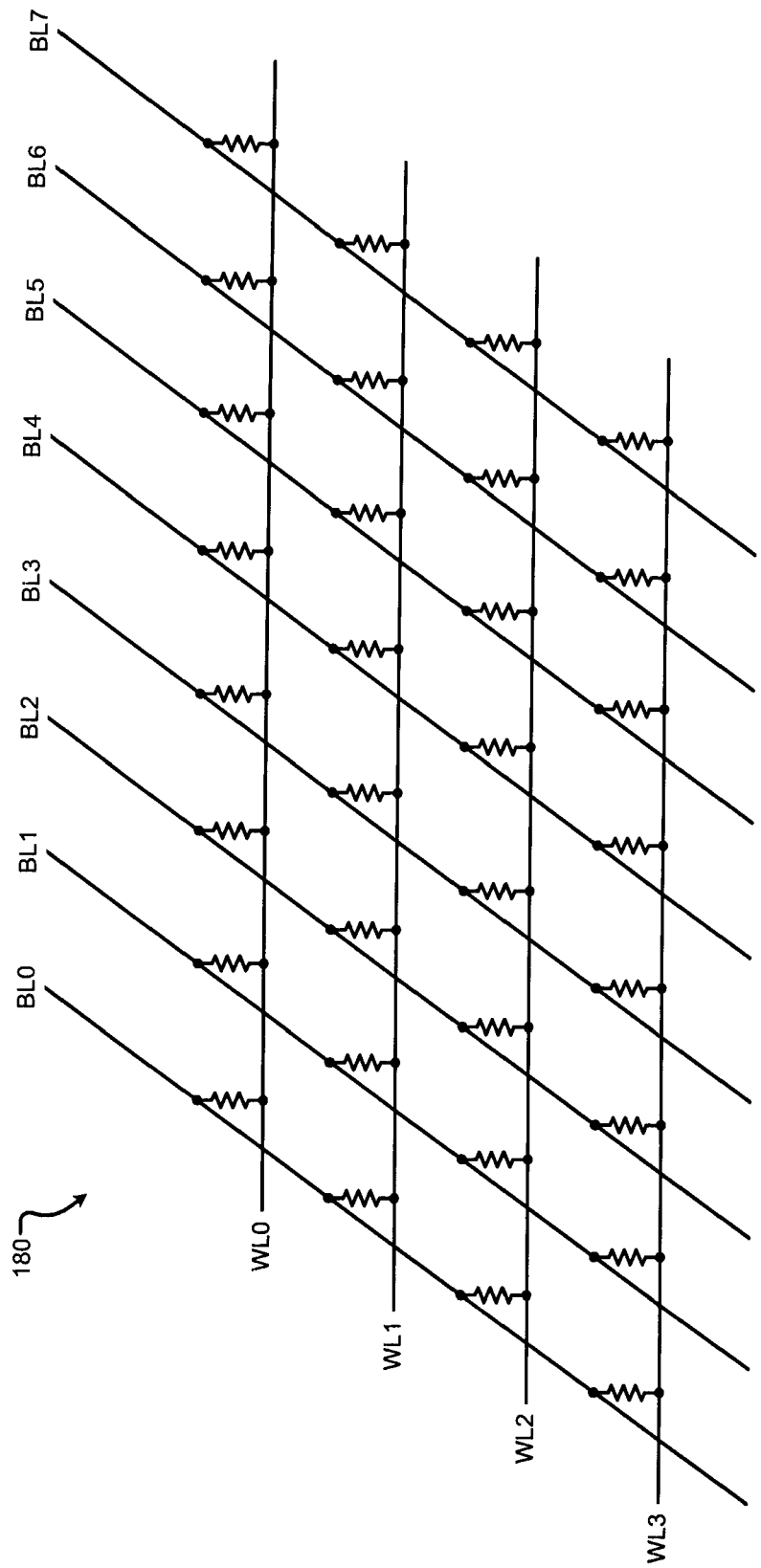
FIG. 9 is schematic a NOR type memory array.
Figure 10:
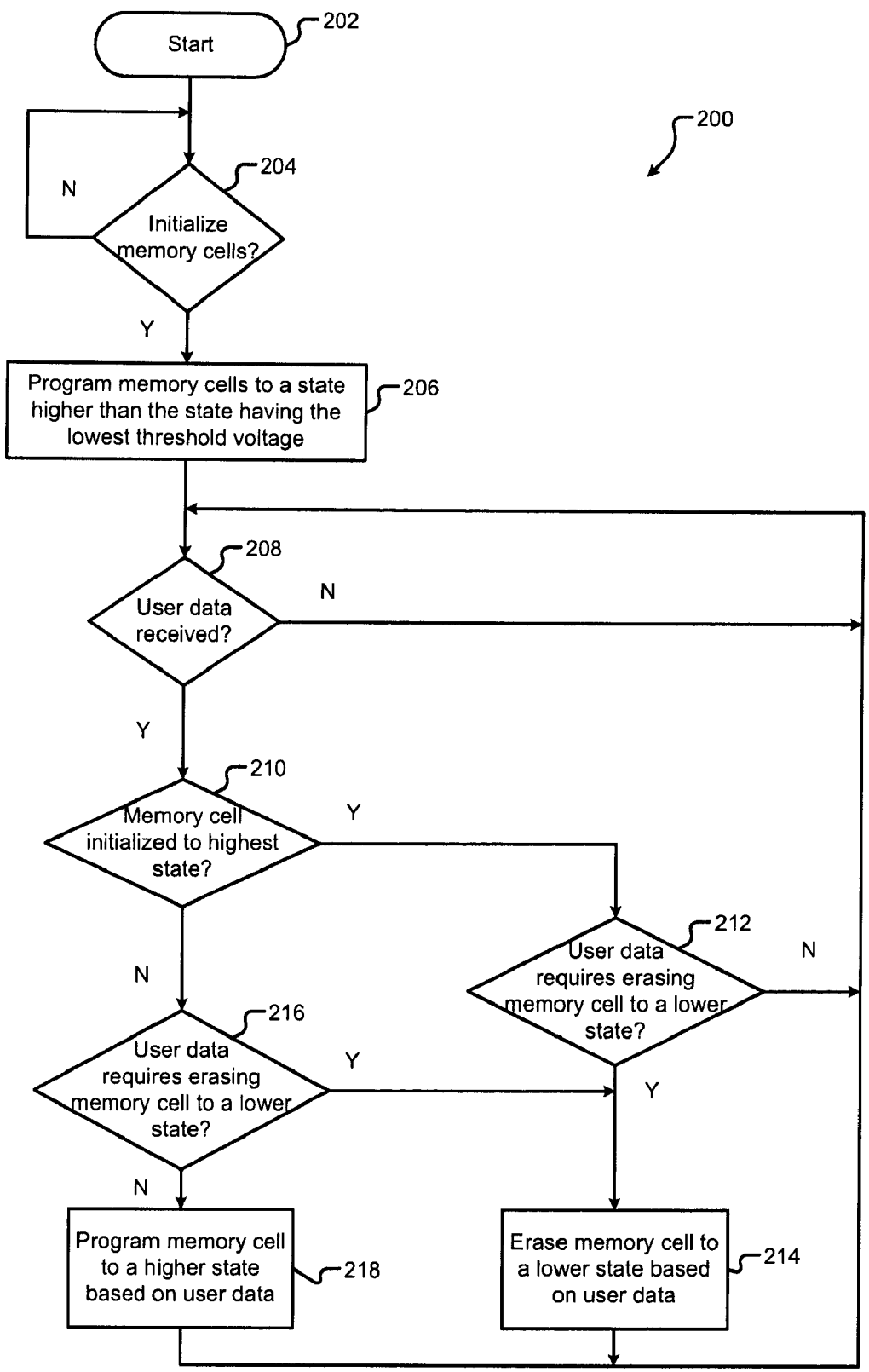
FIG. 10 is a flow chart of the two-step method of FIGS. 7A and 7B.
Figure 11A:
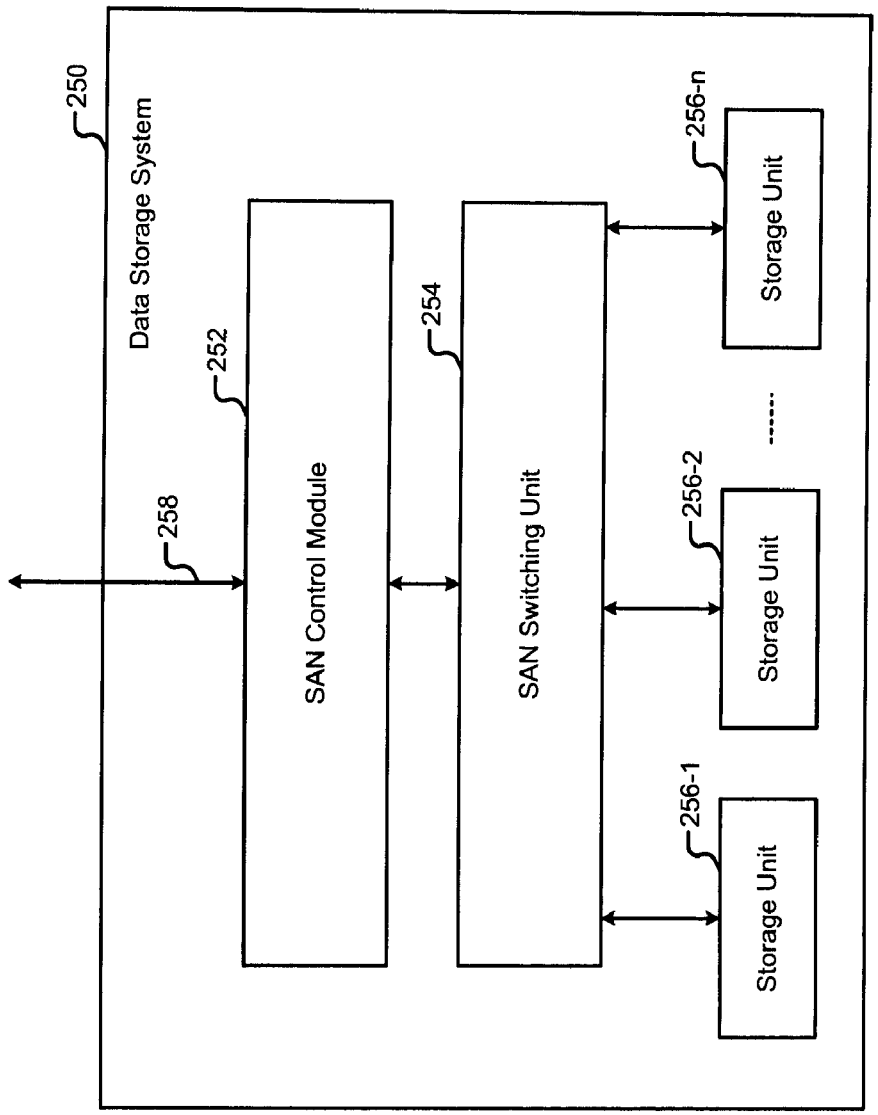
FIG. 11A is a functional block diagram of a data storage system comprising storage units according to the present disclosure.
Figure 11B:
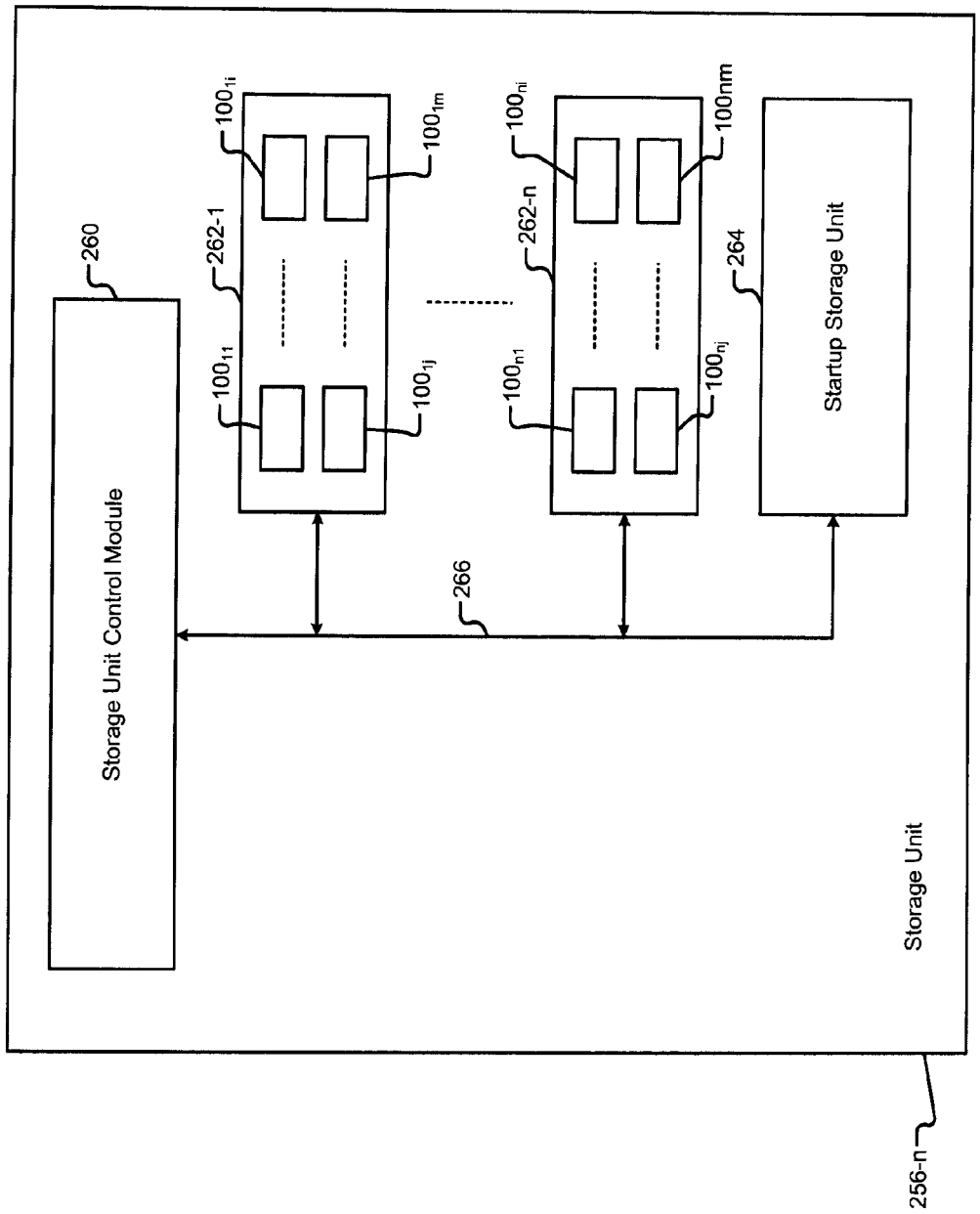
FIG. 11B is a functional block diagram of a storage unit of the data storage system of FIG. 11A according to the present disclosure.

Operation of an exemplary memory IC that operates the memory arrays of FIGS. 3 and 4 using a novel two-step method is discussed in conjunction with FIGS. 6A and 6B. The two-step method is discussed in conjunction with FIGS. 7A and 7B. Examples of other types of memory arrays that can be operated using the two-step method are shown in FIGS. 8 and 9. A flowchart of the two-step method is shown in FIG. 10. Exemplary applications of the teachings of the present disclosure are shown in FIGS. 11A and 11B.

Referring now to FIGS. 1A and 1B, an exemplary memory IC 10 is shown. In FIG. 1A, the memory IC 10 typically comprises a memory array 12, a word line (WL) decoder 16, a bit line (BL) decoder 18, a control module 20, and current sensing amplifiers 30. The memory array 12 comprises memory cells 14 arranged in rows and columns as shown. The WL and BL decoders 16, 18 select the WLs and BLs, respectively, depending on the addresses of the memory cells 14 selected during program, read, and/or erase operations. The BL decoder 18 outputs a program voltage to selected bit lines during program operations. Additionally, the BL decoder 18 connects the selected bit lines to the current sensing amplifiers 30 during read or verify operations. The control module 20 controls the program, read, and/or erase operations of the memory cells 14.

The current sensing amplifiers 30 communicate with the memory cells 14 via bit lines and sense currents that flow through the memory cells 14. During a read operation, the WL decoder 16 selects a word line that communicates with the memory cells 14 to be read. Each of the current sensing amplifiers 30 applies a small voltage across a pair of bit lines that communicate with a memory cell 14 on the selected word line. Based on whether the state of the memory cells 14 is on or off, current flowing through the memory cells 14 is high or low. Accordingly, the control module 20 determines the states of the memory cells 14 based on the currents sensed by the current sensing amplifiers 30.

In FIG. 1B, the control module 20 comprises an initialization module 22, a program module 24, an erase module 26, a verification module 28, and a charge pump 32. The initialization module 22 initializes the memory cells 14 using an over-erase operation when an initialize command is received from a host (not shown). The program module 24 uses a program operation to program the memory cells 14 with user data. The erase module 26 uses an erase operation to erase the memory cells 14 based on the user data. The verification module 28 verifies data stored in the memory cells 14 after the program and/or erase operations.

The charge pump 32 receives a supply voltage $V_{supply}$ and generates voltages $V_{over-erase}$, $V_{program}$, and $V_{erase}$ based on the supply voltage $V_{supply}$. The voltages $V_{over-erase}$, $V_{program}$, and $V_{erase}$ are used by the initialization module 22, the program module 24, the erase module 26 to initialize, program, and erase the memory cells 14, respectively.

Specifically, the initialization module 22 typically initializes the memory cells 14 at block-level. Accordingly, the initialization module 22 selects a block of memory cells 14 (i.e., a memory block) for initialization. The initialization module 22 uses the voltage $V_{over-erase}$, which is a relatively high voltage, to completely erase the memory cells 14 so that the memory cells 14 are ready for programming according to user data. The initialization module 22 uses the relatively high voltage $V_{over-erase}$ to completely erase the memory cells 14 since the initialization of the memory cells 14 cannot be verified at block-level. The initialization module 22 provides the voltage $V_{over-erase}$ to the WL decoder 16. The WL decoder 16 outputs the voltage $V_{over-erase}$ to the memory block that is selected for the over-erase operation by selecting appropriate word lines.

During the program operation, the program module 24 provides the voltage $V_{program}$ to the BL decoder 18. The BL decoder 18 outputs the voltage $V_{program}$ to the bit lines. The WL decoder 16 selects the memory cells 14 for programming the memory cells 14 with the user data.

The erase module 26 typically erases the memory cells 14 at block-level. Accordingly, the erase module 26 selects a memory block comprising the memory cells 14 to be erased. The erase module 26 provides the voltage $V_{erase}$ to the WL decoder 16. The WL decoder 16 outputs the voltage $V_{erase}$ to the selected memory block by selecting appropriate word lines. The selected memory cells 14 are erased according to the user data.

The verification module 28 verifies the data stored in the memory cells 14 based on the currents sensed by the current sensing amplifiers 30. The verification module 28 comprises a read module 34 and a comparing module 36. The read module 34 reads the currents generated by the current sensing amplifiers 30. The comparing module 36 compares the currents to reference currents and determines the states of the memory cells 14. The verification module 28, however, cannot verify whether the memory cells 14 are completely erased for a NOR type array by the over-erase operation due to reasons explained below.

Each memory cell 14 may comprise an electrically alterable nonvolatile memory cell such as a flash memory cell that uses a charge storage region to store charge. Throughout this disclosure, the flash memory cell is used only as an example of the electrically alterable nonvolatile memory cell. The teachings of the disclosure apply equally to other types of electrically alterable nonvolatile memory cells.

In the flash memory cell 14, the charge storage region typically comprises a floating gate of a transistor. The amount of charge stored in the charge storage region modifies a threshold voltage $V_t$ of the memory cell 14 when a word line of the memory array 12 is used as a gate of the memory cell 14. The threshold voltage $V_t$ determines a state of the memory cell 14.

When the memory cell 14 can store N bits of information, the memory cell 14 can store S different amounts of charge, has S different threshold voltages, and has S different states, where N is an integer greater than or equal to 1, and $S=2^N$. When N is greater than or equal to 2, the memory cell 14 is called a multilevel nonvolatile memory cell.

Referring now to FIG. 2, a schematic of a flash memory cell 14 is shown. The memory cell 14 comprises three regions: a source, a drain, and a word line. The word line may be U-shaped as shown. Alternatively, the word line may be rounded or straight. A floating gate is shown as an example of the charge storage region. The memory cell 14 can be an n-channel or a p-channel memory cell.

Adding electrons or negative charge to the floating gate of an n-channel memory cell 14 can increase the threshold voltage $V_t$ and is typically called the program operation. The program module 24 performs the program operation. Conversely, removing electrons or negative charge from the floating gate of the N-channel memory cell 14 can decrease the threshold voltage $V_t$ and is typically called the erase operation. Alternatively, the erase operation may include injecting holes (i.e., positive charges) that neutralize the negatively charged electrons on the floating gate of the n-channel memory cell 14. The erase module 26 performs the erase operation.

The floating gate may include a floating poly-silicon conductor located between the word line and a silicon channel as shown. Alternatively, the charge storage region can be implemented using other substances having charge storing capability. For example, the floating gate can be implemented using a dielectric having traps as the storage sites (i.e., a trapping dielectric) or using crystalline nanoparticles (i.e., nanocrystals or nanodots). The trapping dielectric can include, for example, a nitride layer formed using Low-Pressure-Chemical-Vapor-Deposition (LPCVD). Alternatively, trapping dielectrics such as $HfO_2$ and $ZrO_2$ having traps of a deeper trapping energy may be used.

The nanocrystals can include silicon nanocrystals of oval shape having a diameter in the range of about 2 nm to about 7 nm. The nanocrystals can be formed by using CVD. The nanocrystals are not limited to the silicon nanocrystals and may also include nanocrystals of any other type of material (e.g., Ge, Si—Ge alloy, $HfO_2$, etc.) that can effectively store charges.

In flash memory, the program operation is usually performed by hot electron injection or by Fowler-Nordheim (FN) tunneling of electrons from the channel to the floating gate. The program operation increases the threshold voltage of the memory cell. Accordingly, a programmed memory cell 14 is in an off state until a gate voltage applied to the gate of the programmed memory cell 14 is greater than or equal to the threshold voltage of the programmed memory cell 14.

The erase operation is usually performed by hot-hole injection from the channel to the floating gate or by FN tunneling of electrons from the floating gate to the channel. The erase operation decreases the threshold voltage of the memory cell. Accordingly, a fully erased memory cell 14 is in an on state.

For the erase operation using FN tunneling, the channel needs to be raised to a relatively high voltage. Since the channel of all the flash memory cells 14 in the memory array 12 is shorted together, the capacitive load is large. The large capacitive load reduces the speed at which the channel can be raised to the relatively high voltage. Accordingly, the erase operation using FN tunneling can be very slow. On the other hand, the program operation moves electrons from the channel to the floating gate and does not need to drive a large capacitive load to a high voltage. Accordingly, the program operation is typically faster than the erase operation.

For the above reasons, the flash memory uses the erase operation to bring the threshold voltage of the memory cells 14 down to a lowest desired value. Specifically, the initialization module 22 performs an over-erase operation that initializes the memory cells 14 by lowering the threshold voltage of the memory cells 14 to the lowest desired value. When the threshold voltage of the memory cells 14 is at the lowest desired value, the memory cells 14 are empty or initialized (i.e., without user data). The lowest desired value of the threshold voltage is used as a starting point to program the empty memory cells 14 to higher states having higher threshold voltages based on user data.

The initialization module 22 typically performs the over-erase operation described above at block-level. A memory block typically comprises a plurality of word lines and bit lines corresponding to a plurality of pages of memory. A page of memory typically refers to a plurality of memory cells 14 on one word line whose threshold voltage can be changed individually during erase or program operation. The flash memory uses a page-program operation to raise the threshold voltage of the memory cells 14 from the lowest desired value to higher desired values according to the user data. The program module 24 typically performs the page-program operation at page-level.

The slower over-erase operation is performed on a larger number of memory cells 14 at block-level (i.e., on memory cells 14 of a memory block). The faster page-program operation is performed on a smaller number of memory cells 14 at page-level (i.e., on memory cells 14 of a page of memory). This works best for balancing data throughput between the over-erase operation performed at block-level and the program operation performed at page-level.

In operating multilevel nonvolatile memory, a verify-after-erase operation (hereinafter an erase-verify operation) may be performed to verify whether certain memory cells 14 are erased. In NOR type memory arrays, however, the erase-verify operation might not be able to be performed as one operation at block-level.

Specifically, in NOR type memory arrays, the memory cells 14 connected to a bit line are in parallel. An over-erased memory cell has $V_t<0$ and is in an on state. Accordingly, during the erase-verify operation, a first erased memory cell on the bit line conducts current and prevents detecting on/off states of other memory cells 14 on the bit line. Here, the on and off states are defined as states of the memory cells 14 with and without channel current, respectively.

Once the first erased memory cell conducts current, states of the other memory cells 14 on the bit line cannot be determined. Accordingly, it may not be possible to verify whether any of the other memory cells 14 are still in a programmed state or whether all the memory cells 14 are erased. This is explained below in further detail.

Referring now to FIGS. 3 and 4, examples NOR type memory arrays are shown. In FIG. 3, a memory block 50 of a NOR type memory array that can be used in the memory array 12 is shown. The memory block 50 includes nine bit lines (BL0-BL8) and six word lines (WL0-WL5). The memory cells between two adjacent bit lines are connected in parallel as shown.

In FIG. 4, a memory block 80 a NOR type memory array that can be used in the memory array 12 is shown. The memory block 80 included five bit lines (BL0-BL4) and three word lines (WL0-WL2). The source of each memory cell of the memory block 80 is connected to one common terminal, such as a reference potential or ground. Although FIGS. 3 and 4 show the configuration of the memory cells at block-level, the configuration can be extended to a memory bank comprising a plurality of memory blocks or to an entire memory array comprising a plurality of memory banks.

First, the erase-verify problem is explained using the exemplary memory block 50 shown in FIG. 3. Assume that the memory cell shown in the dashed circle is erased when the memory block underwent an erase pulse. That is, only the memory cell shown in the dashed circle has a threshold voltage low enough to conduct current during the erase-verify operation. Subsequently, during a block-level erase-verify operation, the current flowing between the two adjacent bit lines BL2 and BL3 indicates only that some memory cells between BL2 and BL3 may have been completely erased. The current, however, does not permit identification as to which memory cells and how many memory cells are still in a programmed state and are not completely erased.

On the other hand, during a block-level program operation, every cell is programmed to an off state in a verify-after-program operation (hereinafter a program-verify operation). In other words, the threshold voltage of the memory cells in the memory block is raised high enough to keep all the memory cells in the off state.

During the program-verify operation, suppose that one of the memory cells between two adjacent bit lines is still conducting current. The current allows a determination to be made as to whether some or all of the memory cells in the memory block need to be further programmed or reprogrammed until no current flows between the two adjacent bit lines.

Thus, for NOR type memory arrays, while the block-level program-verify operation is possible, the block-level erase-verify operation may not be possible. A similar block-level erase-verify problem occurs in the exemplary memory block 80 shown in FIG. 4.

Figure 5:
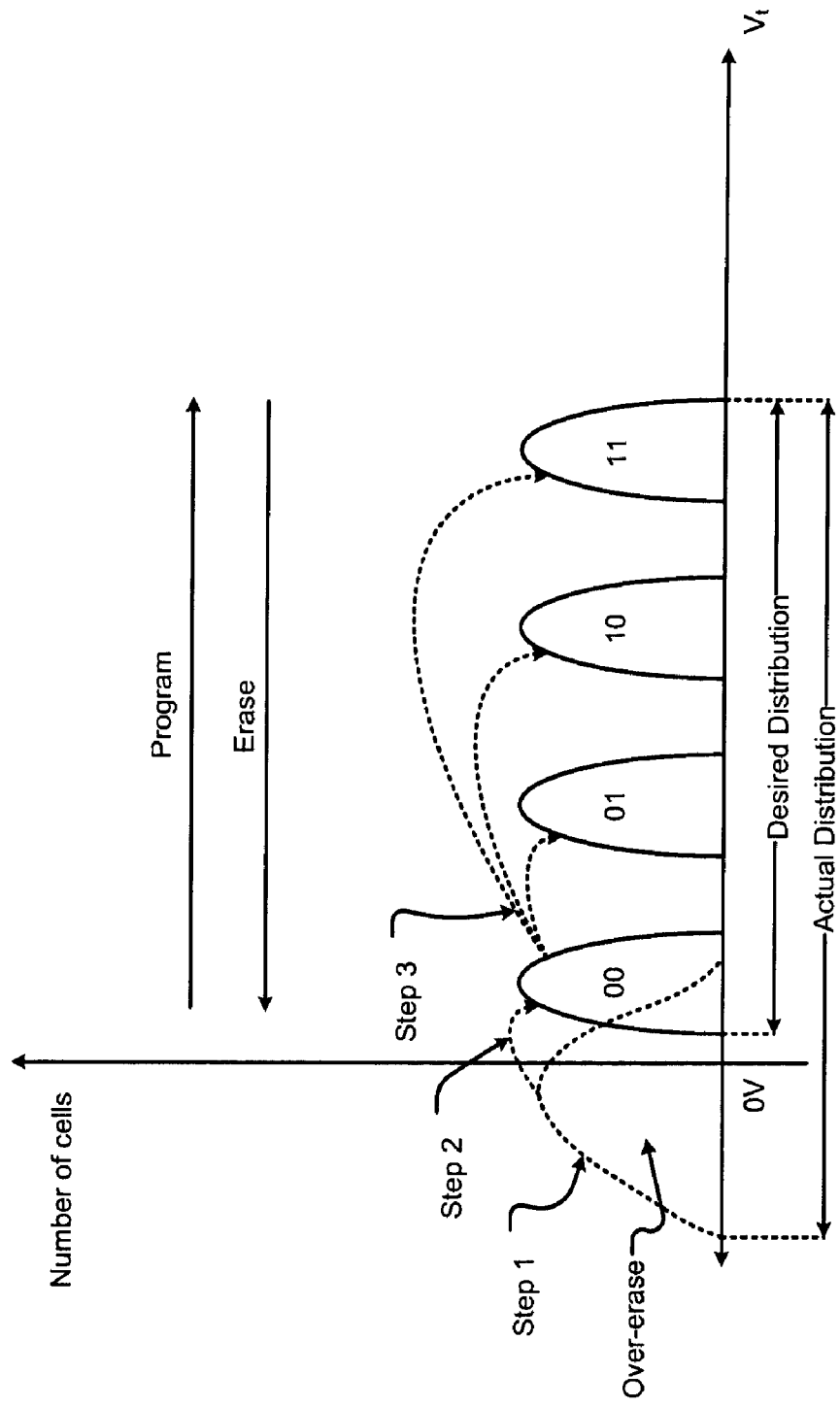
FIG. 5 depicts steps of a three-step method for operating the memory cell of FIG. 2.

Referring now to FIG. 5, the block-level erase-verify problem is illustrated in further detail. Specifically, a three-step method for operating a NOR type flash memory array is discussed. The three steps of the method are described below in turn.

In step 1, the initialization module 22 over-erases the whole memory block to a broader than desired threshold voltage distribution. That is, the memory cells 14 are erased beyond the lowest desired value of threshold voltage of the memory cells.

For example, for n-channel memory cells, the desired distribution of the threshold voltage may range between first and second voltage levels when the memory cell is in any programmed state (e.g., 00, 01, 10, or 11). The first voltage level may have a value slightly greater than 0V and may correspond to a first (i.e., a lowest) state of the memory cell 14 (e.g., 00). The second voltage level may be greater than the first voltage level and may correspond to a last (i.e., a highest) state of the memory cell 14 (e.g., 11).

The memory cells 14 are over-erased such that the threshold voltage of the over-erased memory cells 14 is decreased below the desired threshold voltage distribution. Specifically, the $V_t$ of the over-erased memory cells 14 is less than 0V, which is less than the first voltage level (i.e., less than $V_t$ corresponding to the lowest state 00) and is outside the desired $V_t$ distribution. Thus, the over-erase operation extends the overall distribution of the threshold voltage of the memory cells 14.

In step 2, the program module 24 performs the program operation at block-level to bring the threshold voltage of the memory cells 14 within the desired tighter distribution. Typically, the program operation raises the threshold voltage of the memory cells 14 to a value that is slightly greater than 0V (e.g., equal to the first voltage level). When the memory cells 14 are programmed to a threshold voltage that is slightly greater than 0V, the memory cells 14 are said to have a pristine no-data state. In other words, the memory cells 14 are initialized and are ready for programming with user data. The pristine no-data state may be the first state (i.e., 00).

In step 3, when user data is received, the program module 24 selectively increases the threshold voltage of individual memory cells 14 during the page-program operation according to user data. For example, the threshold voltage of the memory cells 14 may be increased from slightly greater than 0V to a threshold voltage that corresponds to one of the program states (i.e., 01, 10, or 11) depending on user data.

The three-step method for operating the NOR type flash memory array has many drawbacks. Since the threshold voltage of the initialized (i.e., over-erased) memory cells 14 is less than 0V, the memory cells 14 are in the on state that precludes erase-verify operation. Over-erasing the memory cells 14 beyond the desired threshold voltage distribution introduces severe electrical stress to the memory cells 14. The severe electrical stress can cause cell cycling and data retention problems.

Today, many flash memory cell structures could offer faster erase operation without having to drive large capacitive load relative to the program operation. Yet the normal operation of the memory cell 14 using the three-step method is slow since the method requires at least three steps to program user data into the memory block.

The step of over-erasing the memory cells 14 can be eliminated, and the memory cells 14 can be operated using a two-step method. Specifically, the memory cells 14 of multi-level nonvolatile memory can be initialized by programming the memory cells 14 to a state higher than the lowest state of the memory cells 14 instead of by over-erasing the memory cells 14. For example, the threshold voltage ($V_t$) of the memory cells 14 can be raised to a $V_t$ value corresponding to one of the higher states instead of lowering the $V_t$ to less than a $V_t$ value corresponding to the lowest state.

Subsequently, when user data is received, the $V_t$ of the individual memory cells 14 may be increased or decreased to a $V_t$ value of other states based on user data. This may require page-level erase-verify or program-verify. Page-level erase-verify or program-verify is feasible since current from memory cells of other pages (other memory cells) can be neglected. The current from the other memory cells can be neglected by not selecting the other memory cells (controlling BL dimension). Alternatively, the current from the other memory cells can be neglected by applying different voltages to different word lines to turn off the other memory cells (controlling WL dimension).

Preferably, the memory cells 14 may be initialized by programming the memory cells 14 to the highest state. That is, the $V_t$ of the memory cells 14 can be raised to a $V_t$ value corresponding to the highest state. Subsequently, when user data is received, the $V_t$ of the individual memory cells 14 may be decreased based on user data to a $V_t$ value of one of the states lower than the highest state.

Initializing the memory cells 14 by programming the memory cells 14 instead of over-erasing the memory cells 14 provides many advantages. Since the memory cells 14 are programmed to one of the states of the memory cells 14, the memory cells 14 are in the off state (i.e., $V_t>0$) instead of in the on state (i.e., $V_t<0$). Accordingly, the programmed state of the memory cells 14 can be verified using the program-verify operation. Specifically, the memory cells 14 can be programmed during initialization using block-level program operation. Subsequently, the programmed states of the memory cells 14 can be verified after initialization using block-level verify operation.

Additionally, the memory cells 14 are not subjected to the severe electrical stress experienced during over-erasing since the threshold voltage distribution is not extended beyond the desired range when programming is used to initialize the memory cells 14. The program operation initializes the memory cells 14 faster than the over-erase operation. The overall speed of operating the memory cells 14 increases since the step of over-erasing is eliminated.

Referring now to FIGS. 6A and 6B, a memory IC 100 is shown. The memory IC 100 comprises the memory array 12, the WL decoder 16, the BL decoder 18, a control module 102, and the current sensing amplifiers 30. The memory array comprises the memory cells 14. In FIG. 6B, the control module 102 comprises the program module 24, the erase module 26, the verification module 28, and a charge pump 38. The charge pump 38 may be omitted for low-voltage nonvolatile memory systems.

The program module 24 programs the memory cells 14 using the program operation. The erase module 26 erases the memory cells 14 using the erase operation. The verification module 28 verifies the programmed states of the memory cells 14. The control module 102 does not include the initialization module 22. The memory cells 14 are initialized by programming instead of by over-erasing. Accordingly, the charge pump 38 does not generate the voltage $V_{over-erase}$.

Specifically, the program module 24 initializes the memory cells 14 when the initialize command is received from the host. The program module 24 initializes the memory cells 14 by programming the memory cells 14 to a state that is greater than the lowest state. For example, the memory cells 14 may have four states: 00, 01, 10, and 11. The program module 24 may initialize the memory cells 14 by programming the memory cells 14 to one of the states 01, 10, or 11.

Preferably, the program module 24 may initialize the memory cells 14 by programming the memory cells 14 to the highest state 11. The program module 24, however, does not initialize the memory cells 14 by programming the memory cell 14 to the lowest state 00 or a state lower than the lowest state 00. Accordingly, the method of operating the memory cells 14 to program user data comprises two steps instead of three steps. The two steps are discussed below in turn.

Figure 7A:
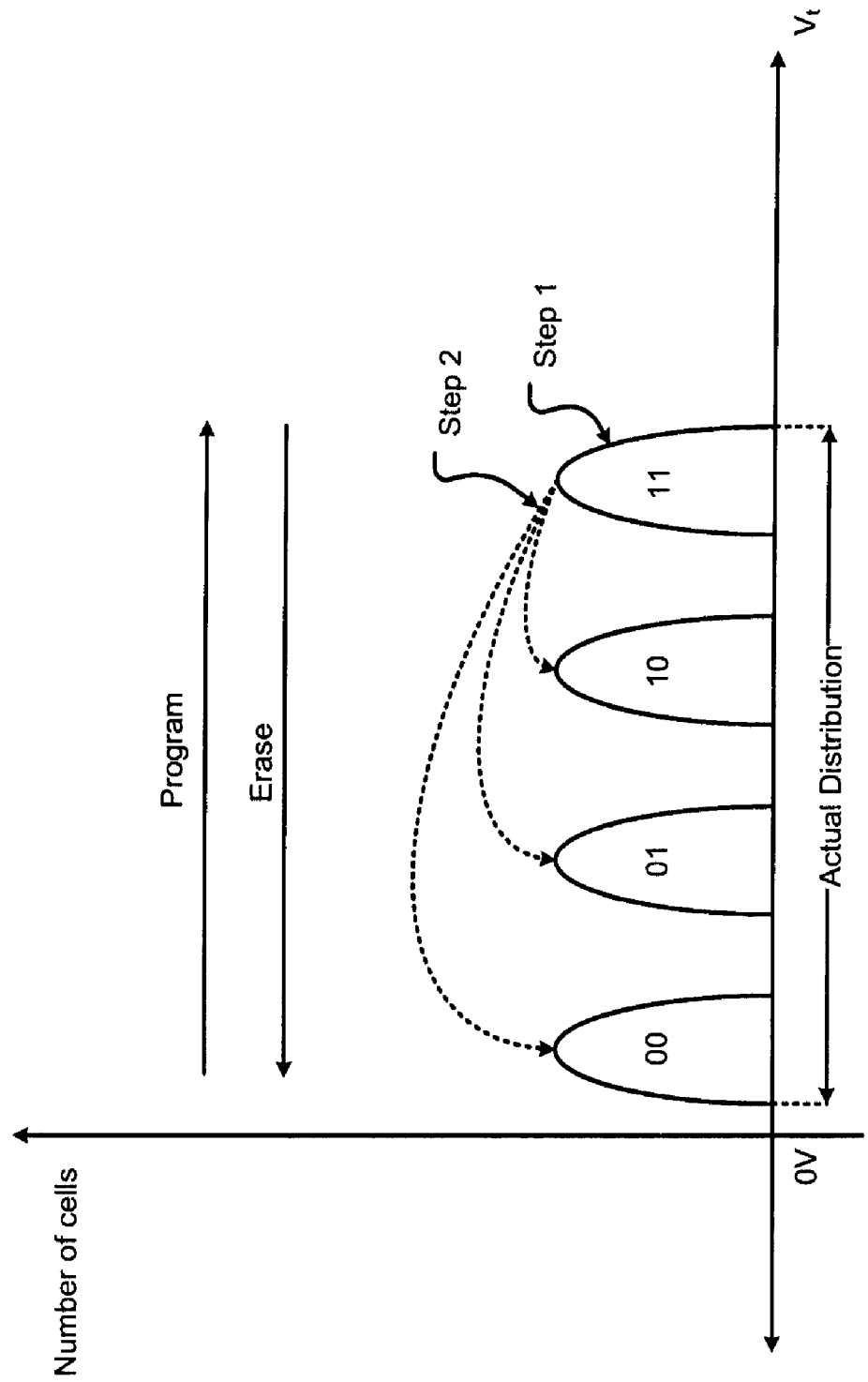
FIG. 7A depicts steps of a two-step method for operating the memory cell of FIG. 2.

Referring now to FIG. 7A, the two steps are shown for n-channel memory cells 14. In the example shown, the threshold voltage of un-programmed (i.e., initialized) memory cells 14 is typically greater than 0V. In Step 1, the program module 24 programs the memory cells 14 of a memory block to a state where all the memory cells 14 of the memory block are in the off state. Specifically, the program module 24 programs the memory cells 14 to a state where the threshold voltage level ($V_t$ level) of the memory cells 14 is raised to a higher (preferably the highest) $V_t$ level within the desired $V_t$ distribution of the memory cells 14. The $V_t$ level corresponds to the state of the pristine no-data state of the memory cells 14.

Since the block-level program-verify operation can now be performed on NOR type arrays, step 1 is feasible. That is, step 1 allows the verification module 28 to perform the program-verify operation at block-level. The verification module 28 performs the program-verify operation at a larger number of cells (e.g., on a bank of memory cells 14, or the entire memory array 12 of the memory cells 14).

Specifically, since the memory cells 14 initialized by the program module 24 (initialized memory cells 14) have $V_t>0V$, the initialized memory cells 14 are in the off state. Accordingly, the verification module 28 can verify whether all the memory cells 14 in the memory block initialized by the program module 24 are in fact initialized. For example, when all the memory cells 14 are initialized, the current sensing amplifiers 30 sense no current through the initialized memory cells 14 since the initialized memory cells 14 are in the off state. Accordingly, the verification module 28 can determine that the initialization is successful when the current sensing amplifiers 30 sense no current through all the memory cells 14.

Occasionally, one or more memory cells 14 on a bit line may fail to initialize (i.e., non-initialized memory cells 14). The non-initialized memory cells 14 may be in the on state and may conduct current when the verification module 28 performs the program-verify operation. The verification module 28 can determine which of the memory cells 14 are not initialized since the other memory cells 14 that are initialized are in the off state. The program module 24 programs the non-initialized memory cells 14 to the $V_t$ level of the pristine no-data state until the current sensing amplifiers 30 sense no current through all the memory cells 14.

Step 1 can be performed using any method that can effectively alter the $V_t$ of the memory cells 14 to a higher level. For example, the program module 24 can perform step 1 using channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, tunneling ballistic-electron injection, etc. U.S. patent application Ser. No. 11/169,399, filed on Jun. 28, 2005 includes descriptions of CHEI, SSI, FN tunneling, ICHE injection, BTBT induced hot-electron injection, tunneling ballistic-electron injection, etc., and is incorporated herein by reference in its entirety.

Step 2 includes a page-erase operation that the erase module 26 performs on each page of memory cells 14 to bring the $V_t$ of the memory cells 14 down to a desired $V_t$ level according to the user data. For example, if the program module 24 has initialized the memory cells 14 to the highest state (11), the erase module 26 decreases the threshold voltage of the memory cells 14 to a $V_t$ value corresponding to a state 10, 01, or 00 depending on the user data.

Additionally, if the program module 24 has initialized the memory cells 14 to a state other than the highest state and the lowest state, step 2 may include the page-program operation. That is, the program module 24 may perform the page-program operation on each page of memory cells 14 to bring the $V_t$ of the memory cells 14 up to a desired $V_t$ level according to the user data.

For example, if the program module 24 has initialized the memory cells 14 to the state 01, the erase module 26 may decrease the threshold voltage of the memory cells 14 to a $V_t$ value corresponding to the state 00 depending on the user data. Additionally, the program module 24 may increase the threshold voltage of the memory cells 14 to $V_t$ value corresponding to the state 10 or 11 depending on the user data.

Alternatively, if the program module 24 has initialized the memory cells 14 to the state 10, the erase module 26 may decrease the threshold voltage of the memory cells 14 to a $V_t$ value corresponding to the state 01 or 00 depending on the user data. Additionally, the program module 24 may increase the threshold voltage of the memory cells 14 to a $V_t$ value corresponding to the state 11 depending on the user data.

Thus, 2 steps, namely program and erase, may be needed to operate the memory cells 14. Additionally, the threshold voltages of the memory cells 14 do not swing beyond the desired $V_t$ distribution. Specifically, the threshold voltages of the memory cells 14 swing between the threshold voltages corresponding to the lowest and the highest states (e.g., $V_t$ for the state 00 and $V_t$ for the state 11). Accordingly, the memory cells 14 are not subjected to undesired electrical stress resulting from the over-erase operation.

During step 2, the erase module 26 may use any method to perform the erase operation that can effectively lower the $V_t$ of the memory cells 14. For example, the erase module 26 may use Band-to-Band tunneling (BTBT) induced hot-hole injection, tunneling ballistic-hole injection, Fowler-Nordheim (FN) tunneling, etc.

In the two-step method, when the initialization state is a state other than the highest state, both the program module 24 and the erase module 26 may write data in the memory cells 14. Accordingly, the program module 24 and the erase module 26 may be collectively referred to as a write module.

Figure 7B:
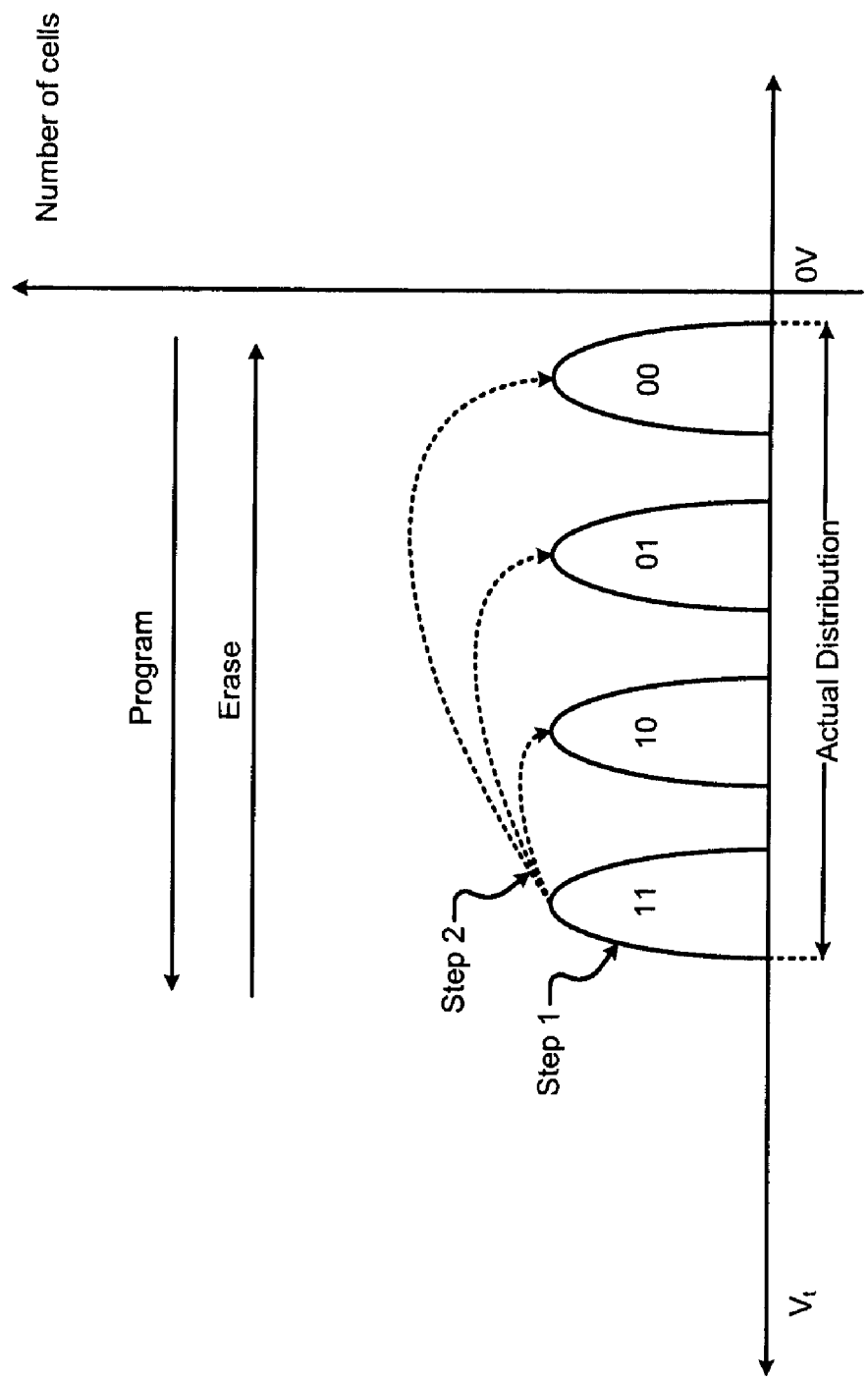
FIG. 7B depicts steps of a two-step method for operating the memory cell of FIG. 2.

Referring now to FIG. 7B, the two-step method for operating the memory cells 14 can be readily extended to p-channel memory cells 14 and the memory array 12 comprising the p-channel memory cells 14. The un-programmed $V_t$, that is, the $V_t$ of initialized p-channel memory cells 14 is typically less than 0V as shown. When user data is received, the $V_t$ of the p-channel memory cells 14 is changed in a direction that is opposite to the direction in which the $V_t$ of the n-channel memory cells 14 is changed.

Specifically, in step 1 for the p-channel memory cells 14, the program module 24 sets the $V_t$ for the pristine no-data state at a level where all the memory cells 14 are in the off state. This can be done by adding opposite type of charges to the floating gate relative to the charges employed in the n-channel memory cells 14. For example, the program module 24 can introduce hot-holes into the floating gate of the p-channel memory cells 14. Alternately, the program module 24 can remove electrons from the floating gate to achieve the same effect, namely, keeping the memory cells 14 in the off state. In step 2, the erase module 26 alters the $V_t$ of the selected memory cells 14 to higher levels as defined by the user data.

Referring now to FIGS. 8 and 9, the two-step method for operating the memory cells 14 of multilevel nonvolatile memory can also be applied to other types of memory as long as the memory cells 14 in the memory block are arranged in NOR configuration. For example, in FIG. 8, a memory array 150 that includes memory cells comprising gate-controlled resistors is shown. The memory cells comprising the gate-controlled resistors have a gate that can be used to change the resistance of the memory cells. Additionally, the gate can be used to switch on/off connections between the memory cells and the bit lines.

Since the memory array 150 is a NOR type memory array, the two-step method can be applied to operate the memory array 150. Specifically, the two-step method can be used to program and program-verify the memory array 150 at block-level. That is, the two-step method can be use to increase memory cell resistance during the program operation and to check current between neighboring bit lines during the program-verify operation.

The program module 24 can initialize the memory cells by programming the memory cells to a high-resistance state. The programmed high-resistance state can be used as the pristine no-data state. The resistance of each individual memory cell can be subsequently decreased in the page-erase operation performed by the erase module 26 according to user data.

In FIG. 9, another NOR type memory array called a cross-point memory array 180 is shown. In the cross-point memory array 180, each memory cell connects to one word line and one bit line running in orthogonal directions as shown. Specifically, the cross-point memory array 180 shown in FIG. 9 is a resistor cross-point memory array or a resistive cross-point array.

A memory cell of the cross-point memory array 180 comprises an electrically alterable resistance and a current limiting device. The resistor could be made of phase-change materials, bridging conductors, or any other type of material whose resistance is electrically alterable. The current limiting device may include a diode or a transistor. The current limiting device can be associated with each memory cell to facilitate write/read operations and to select/deselect the memory cells.

The cross-point memory array 180 essentially is a NOR type memory array where all the memory cells connected to one bit line are in parallel. Accordingly, the two-step method can be applied to operate the cross-point memory array 180. The program module 24 may program all the memory cells to a high-resistance state (i.e., the pristine no-data state) during initialization. Specifically, the program module 24 increases the resistance of the electrically alterable resistors of the memory cells. Subsequently, the erase module 26 performs the page-erase operation to decrease the resistance of the resistors of the memory cells according to user data.

Referring now to FIG. 10, the two-step method 200 for initializing and operating multilevel nonvolatile memory is shown. Control begins in step 202. Control determines in step 204 whether to initialize the memory cells 14. Control waits if the result of step 204 is false. If the result of step 204 is true, control initializes the memory cells 14 in step 206 by programming the memory cells 14 to a state that is higher than the state having the lowest threshold voltage.

Control determines in step 208 whether user data to be written in the memory cell 14 is received. Control waits if the result of step 208 is false. If the result of step 208 is true, control determines in step 210 whether the memory cell 14 was initialized to the highest state during initialization. If the result of step 210 is true, control determines in step 212 whether the user data requires erasing the memory cell 14 to a state that is lower than the highest state. If the result of step 212 is false, the state of the memory cell 14 programmed during initialization correctly represents the user data to be written into the memory cell 14, and control returns to step 208. If the result of step 212 is true, control erases the memory cell 14 to a state lower than the initialized state according to the user data in step 214, and control returns to step 208.

If the result of step 210 is false, control determines in step 216 whether the user data requires erasing the memory cell 14 to a state that is lower than the initialized state of the memory cells 14. If the result of step 216 is true, control performs step 214 and returns to step 208. If the result of step 216 is false, control programs the memory cell 14 to a state higher than the initialized state according to the user data in step 218, and control returns to step 208.

Referring now to FIGS. 11A and 11B, the teachings of the present disclosure can be extended to storage products including data storage systems and solid-state drives (SSDs). SSDs are data storage devices that use solid-state memory (e.g., flash memory) to store data. The architecture and configuration of the data storage system shown in FIGS. 11A and 11B are exemplary. Other architectures and device configurations are contemplated.

In FIG. 11A, for example only, a data storage system 250 may comprise a storage area network (SAN) control module 252, a SAN switching unit 254, and storage units 256-1, 256-2, ..., and 256-n (collectively storage units 256), where n is an integer greater than 1. The SAN control module 252 may comprise a control unit that interfaces the data storage system 250 to one or more external devices (not shown) through an input/output (I/O) bus 258. For example, the control unit may include a processor, a microprocessor, an ASIC, a state machine, etc. For example, the external devices may include a host, a server, etc. The I/O bus 258 may comprise a bus that provides high speed and wide bandwidth for data transmission. For example, the I/O bus 258 may include fiber-channels, Ethernet, etc. For example only, the transmission speed of the I/O bus 258 may be faster than 10 gigabits per second (10 Gb/s).

Additionally, the SAN control module 252 may control the SAN switching unit 254. For example only, the SAN switching unit 254 may include a plurality of switches. Each of the switches may interface with one of the storage units 256 and may be controlled by the SAN control module 252. The storage units 256 may store information that includes audio data, video data, and/or any other types of data in a digital format.

In FIG. 11B, for example only, one of the storage units 256 (e.g., the storage unit 256-n) may comprise a storage unit control module 260, solid-state drives (SSDs) 262-1, ..., and 262-n (collectively SSDs 262), a startup storage unit 264, and a bus 266, where n is an integer greater than 1. Each of the SSDs 262 may comprise one or more of the memory IC 100. For example only, the SSD 262-1 may comprise memory ICs 100$_{11}$, ..., 100$_{1i}$, 100$_{1j}$, ..., and 100$_{1m}$, where m is an integer greater than 1. Additionally, each of the SSDs 262 may comprise a memory controller (not shown) that controls the one or more of the memory IC 100. The startup storage unit 264 may include code for operating the storage unit control module 260. Using the code, the storage unit control module 260 may control the SSDs 262 via the bus 266.

Figure 12A:
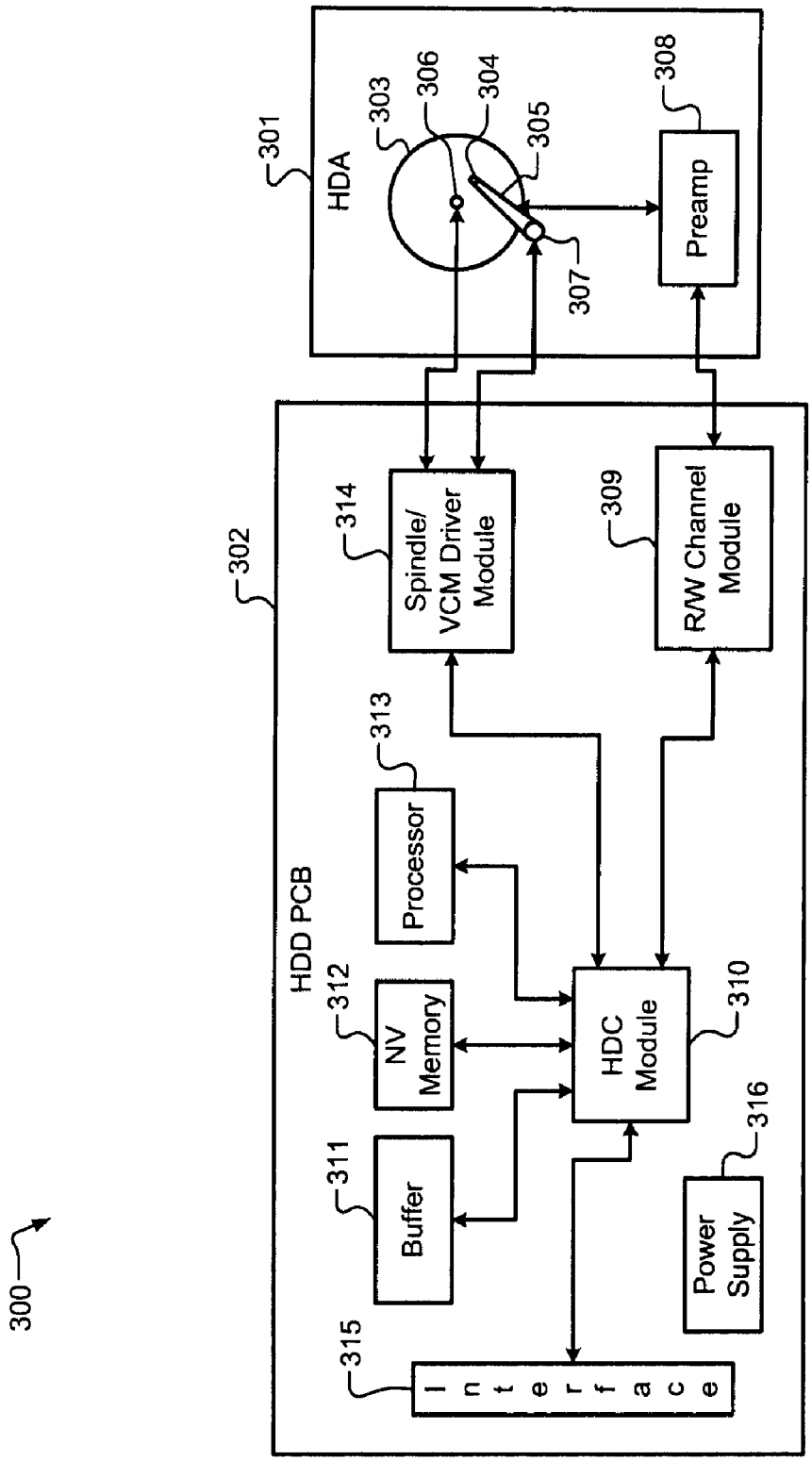
FIG. 12A is a functional block diagram of a hard disk drive.

Referring now to FIGS. 12A-12E, various exemplary implementations incorporating the teachings of the present disclosure are shown. In FIG. 12A, the teachings of the disclosure can be implemented in nonvolatile memory 312 and associated control circuitry of a hard disk drive (HDD) 300. The associated control circuitry may be part of the nonvolatile memory 312 or a separate circuit (not shown) in communication with the nonvolatile memory 312.

The HDD 300 includes a hard disk assembly (HDA) 301 and an HDD printed circuit board (PCB) 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD PCB 302 includes a read/write channel module (hereinafter, "read channel") 309, a hard disk controller (HDC) module 310, a buffer 311, nonvolatile memory 312, a processor 313, and a spindle/VCM driver module 314. The read channel 309 processes data received from and transmitted to the preamplifier device 308. The HDC module 310 controls components of the HDA 301 and communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the read channel 309, the buffer 311, nonvolatile memory 312, the processor 313, the spindle/VCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. Nonvolatile memory 312 may include any suitable type of semiconductor or solid-state memory, such as flash memory (including NAND and NOR flash memory), phase change memory, magnetic RAM, and multi-state memory, in which each memory cell has more than two states. The spindle/VCM driver module 314 controls the spindle motor 306 and the VCM 307. The HDD PCB 302 includes a power supply 316 that provides power to the components of the HDD 300.

Figure 12B:
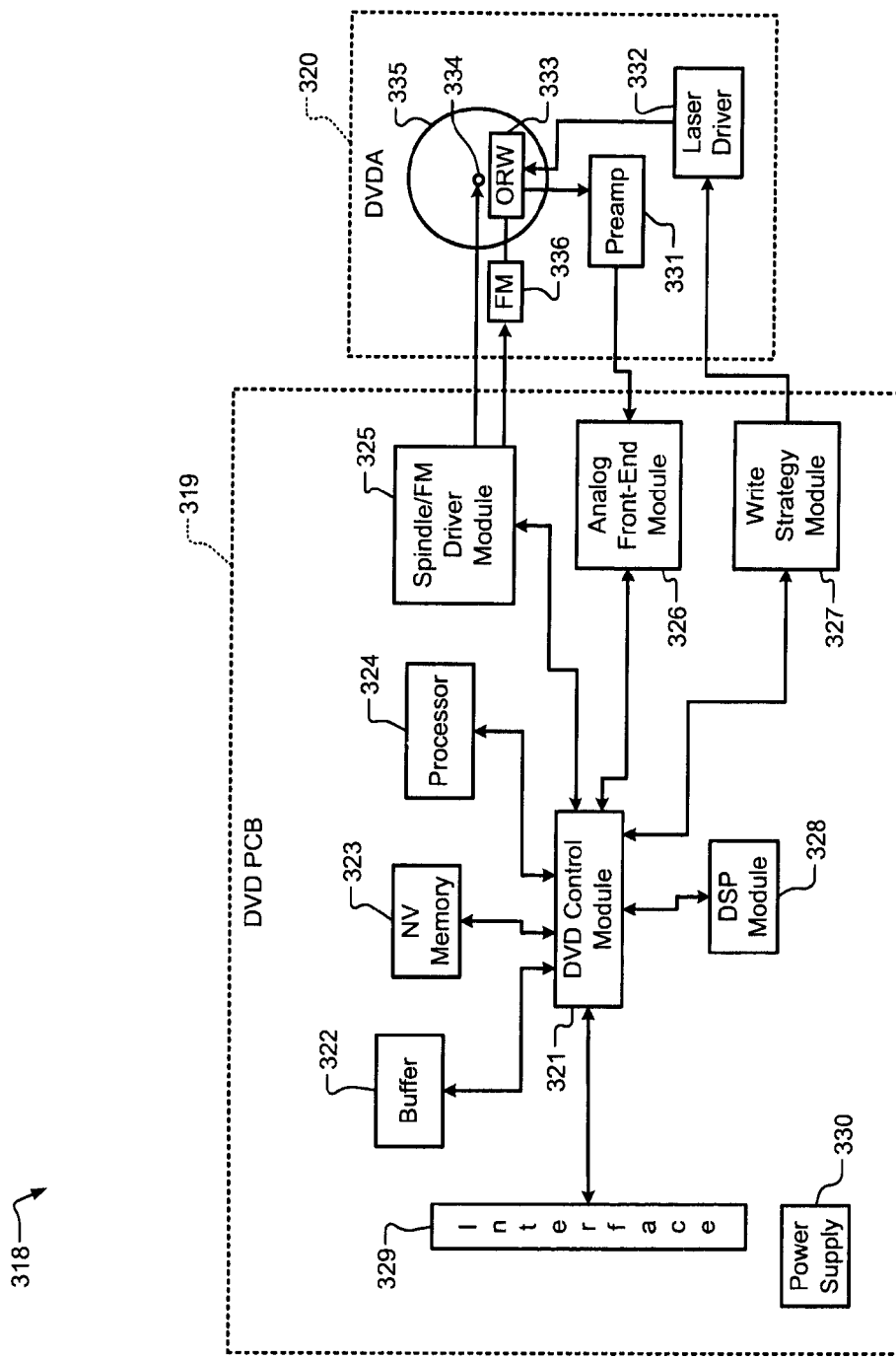
FIG. 12B is a functional block diagram of a DVD drive.

In FIG. 12B, the teachings of the disclosure can be implemented in nonvolatile memory 323 and associated control circuitry of a DVD drive 318 or of a CD drive (not shown). The associated control circuitry may be part of the nonvolatile memory 323 or a separate circuit (not shown) in communication with the nonvolatile memory 323. The DVD drive 318 includes a DVD PCB 319 and a DVD assembly (DVDA) 320. The DVD PCB 319 includes a DVD control module 321, a buffer 322, nonvolatile memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. Nonvolatile memory 323 may include any suitable type of semiconductor or solid-state memory, such as flash memory (including NAND and NOR flash memory), phase change memory, magnetic RAM, and multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 12D:
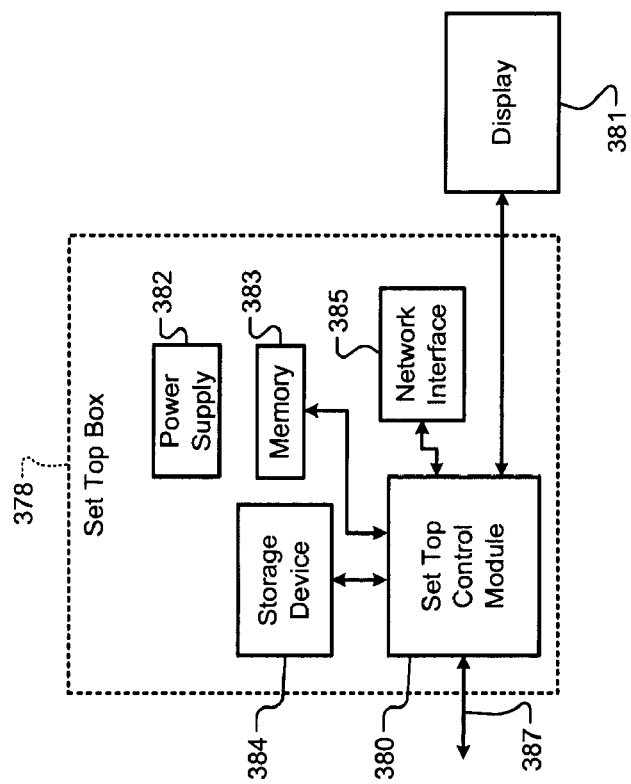
FIG. 12D is a functional block diagram of a set top box.
Figure 12C:
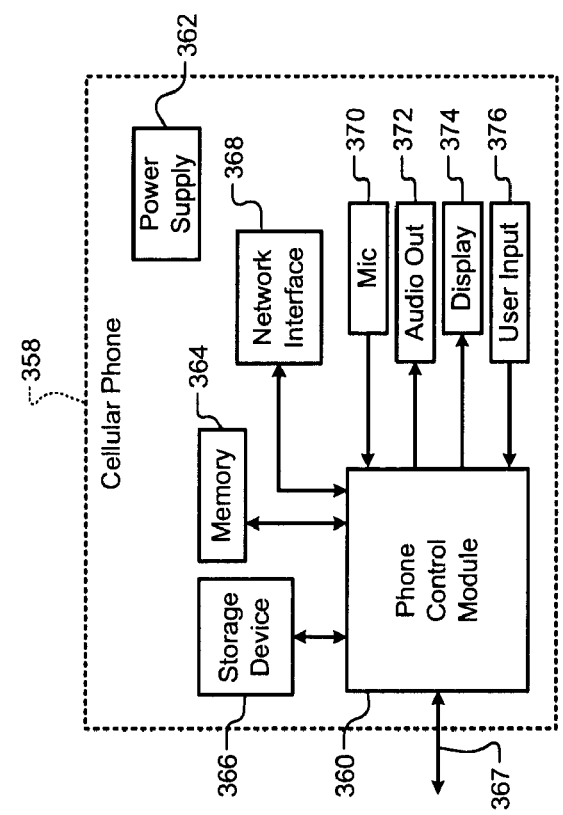
FIG. 12C is a functional block diagram of a cellular phone.

Referring now to FIG. 12C, the teachings of the disclosure can be implemented in memory 364 and associated control circuitry of a cellular phone 358. The associated control circuitry may be part of the memory 364 or a separate circuit (not shown) in communication with the nonvolatile memory 364. The cellular phone 358 includes a phone control module 360, a power supply 362, memory 364, a storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 366 may include an optical storage drive, such as a DVD drive, and/or a hard disk drive (HDD). The power supply 362 provides power to the components of the cellular phone 358.

In FIG. 12D, the teachings of the disclosure can be implemented in memory 383 and associated control circuitry of a set top box 378. The associated control circuitry may be part of the memory 383 or a separate circuit (not shown) in communication with the nonvolatile memory 383. The set top box 378 includes a set top control module 380, a display 381, a power supply 382, memory 383, a storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 384 may include an optical storage drive, such as a DVD drive, and/or a hard disk drive (HDD).

Figure 12E:
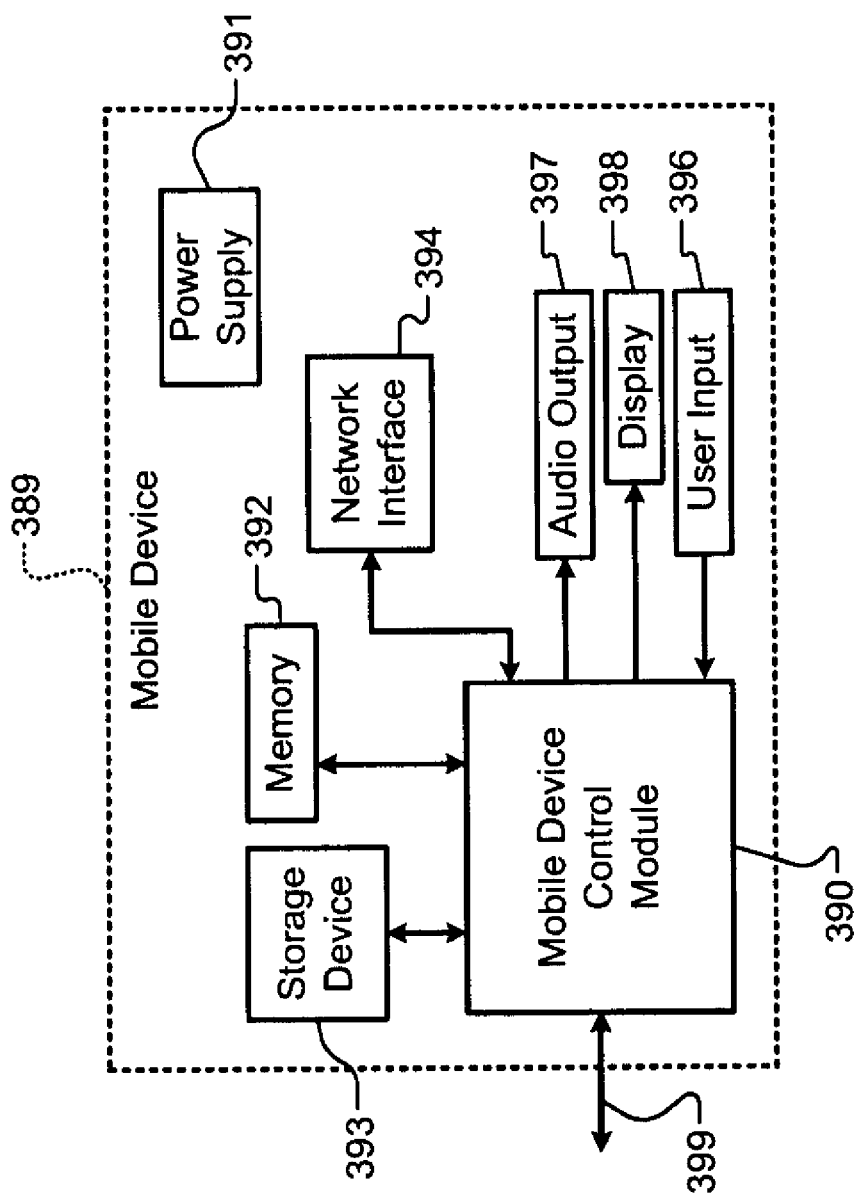
FIG. 12E is a functional block diagram of a mobile device.

In FIG. 12E, the teachings of the disclosure can be implemented in memory 392 and associated control circuitry of a mobile device 389. The associated control circuitry may be part of the memory 392 or a separate circuit (not shown) in communication with the nonvolatile memory 392. The mobile device 389 may include a mobile device control module 390, a power supply 391, memory 392, a storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
   an input that receives a control signal; and
   a program module that initializes a nonvolatile multilevel memory cell based on said control signal by programming said nonvolatile multilevel memory cell to one of S states of said nonvolatile multilevel memory cell, wherein said one of said S states is different than a lowest one of said S states, where S is an integer greater than 1.

2. The system of claim 1 wherein said one of said S states includes a highest one of said S states.

3. The system of claim 1 wherein said S states are based on S threshold values of said nonvolatile multilevel memory cell, respectively, and wherein said lowest one of said S states corresponds to one of said S threshold values that has a lowest absolute value.

4. The system of claim 3 wherein said S threshold values include one of S threshold voltages and S threshold currents.

5. The system of claim 1 wherein said nonvolatile multilevel memory cell is in an off state when programmed to said one of said S states.

6. The system of claim 1 further comprising a verification module that verifies that said nonvolatile multilevel memory cell is programmed to said one of said S states.

7. The system of claim 1 wherein a first absolute value of a first threshold voltage of said nonvolatile multilevel memory cell corresponding to said one of said S states is greater than a second absolute value of a second threshold voltage of said nonvolatile multilevel memory cell corresponding to said lowest one of said S states and less than or equal to a third absolute value of a third threshold voltage of said nonvolatile multilevel memory cell corresponding to a highest one of said S states.

8. The system of claim 1 wherein said program module programs said nonvolatile multilevel memory cell with user data by adjusting a threshold voltage of said nonvolatile multilevel memory cell.

9. The system of claim 8 wherein said program module increases an absolute value of said threshold voltage.

10. The system of claim 1 further comprising an erase module that erases said nonvolatile multilevel memory cell by adjusting a threshold voltage of said nonvolatile multilevel memory cell to store user data.

11. The system of claim 10 wherein said erase module decreases an absolute value of said threshold voltage.

12. The system of claim 1 wherein said program module writes user data in said nonvolatile multilevel memory cell by programming said nonvolatile multilevel memory cell when said one of said S states excludes a highest one of said S states.

13. The system of claim 1 further comprising an erase module that writes user data in said nonvolatile multilevel memory cell by erasing said nonvolatile multilevel memory cell when said one of said S states includes a highest one of said S states.

14. The system of claim 1 wherein said program module initializes said nonvolatile multilevel memory cell using one of channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, and tunneling ballistic-electron injection.

15. The system of claim 10 wherein said erase module erases said nonvolatile multilevel memory cell using one of Band-to-Band tunneling (BTBT) induced hot-hole injection, tunneling ballistic-hole injection, and Fowler-Nordheim (FN) tunneling.

16. The system of claim 1 wherein said nonvolatile multilevel memory cell includes a flash memory cell having a source, a drain, a floating gate, and one of an n-channel and a p-channel.

17. The system of claim 16 wherein said floating gate includes one of a poly-silicon conductor, a trapping dielectric, and nanocrystals.

18. The system of claim 17 wherein said trapping dielectric comprises one of a nitride layer, hafnium oxide ($HfO_2$), and zirconium oxide ($ZrO_2$).

19. The system of claim 17 wherein said nanocrystals comprise oval-shaped silicon nanocrystals having a diameter between 2 nm and 7 nm.

20. The system of claim 17 wherein said nanocrystals comprise one of germanium (Ge), hafnium oxide ($HfO_2$), and a silicon-germanium (Si—Ge) alloy.

21. The system of claim 1 wherein said nonvolatile multilevel memory cell comprises a gate-controlled resistance.

22. The system of claim 1 wherein said nonvolatile multilevel memory cell comprises an electrically alterable resistance that communicates with a current limiting device.

23. The system of claim 22 wherein said electrically alterable resistance comprises one of a phase change material and a bridging conductor, and wherein said current limiting device includes one of a diode and a transistor.

24. A memory integrated circuit (IC) comprising the system of claim 1 and further comprising a memory array that includes an array of said nonvolatile multilevel memory cells.

25. The memory IC of claim 24 wherein said memory array includes word lines and bit lines that communicate with said nonvolatile multilevel memory cells.

26. The memory IC of claim 24 wherein said program module programs a block of said nonvolatile multilevel memory cells in a memory block using a block-level program operation.

27. The memory IC of claim 26 wherein said memory block includes a plurality of word lines and bit lines corresponding to a plurality of pages, and wherein one of said pages includes a plurality of said nonvolatile multilevel memory cells on one of said word lines.

28. The memory IC of claim 26 further comprising a verification module that uses a block-level verify operation to verify that said nonvolatile multilevel memory cells of said memory block are programmed to said one of said S states.

29. The memory IC of claim 26 further comprising an erase module that erases said nonvolatile multilevel memory cells of said memory block using a page-level erase operation.

30. The memory IC of claim 24 wherein said memory array includes a resistive cross-point array.

31. A solid-state drive (SSD) comprising the memory IC of claim 24.

32. A data storage system comprising a storage area network (SAN) control module that controls a plurality of storage units each comprising a plurality of the SSD of claim 31.

33. A method comprising:

receiving a control signal; and initializing a nonvolatile multilevel memory cell based on said control signal by programming said nonvolatile multilevel memory cell to one of S states of said nonvolatile multilevel memory cell, wherein said one of said S states is different than a lowest one of said S states, where S is an integer greater than 1.

34. The method of claim 33 further comprising initializing said nonvolatile multilevel memory cell by programming said nonvolatile multilevel memory cell to a highest one of said S states.

35. The method of claim 33 further comprising:
determining said S states based on S threshold values of said nonvolatile multilevel memory cell, respectively; and
selecting one of said S threshold values having a lowest absolute value as said lowest one of said S states,
wherein said S threshold values include one of S threshold voltages and S threshold currents.

36. The method of claim 33 further comprising verifying that said nonvolatile multilevel memory cell is programmed to said one of said S states, wherein said nonvolatile multilevel memory cell is in an off state when programmed to said one of said S states.

37. The method of claim 33 further comprising initializing said nonvolatile multilevel memory cell by selecting a first absolute value of a first threshold voltage corresponding to said one of said S states greater than a second absolute value of a second threshold voltage corresponding to said lowest one of said S states and less than or equal to a third absolute value of a third threshold voltage corresponding to a highest one of said S states.

38. The method of claim 33 further comprising programming said nonvolatile multilevel memory cell with user data by increasing an absolute value of a threshold voltage of said nonvolatile multilevel memory cell.

39. The method of claim 33 further comprising erasing said nonvolatile multilevel memory cell by decreasing an absolute value of a threshold voltage of said nonvolatile multilevel memory cell to store user data.

40. The method of claim 33 further comprising writing user data in said nonvolatile multilevel memory cell by:
programming said nonvolatile multilevel memory cell when said one of said S states excludes a highest one of said S states; and
erasing said nonvolatile multilevel memory cell when said one of said S states includes a highest one of said S states.

41. The method of claim 33 further comprising initializing said nonvolatile multilevel memory cell using one of channel hot-electron injection (CHEI), source-side injection (SSI), Fowler-Nordheim (FN) tunneling, impacted-channel hot-electron (ICHE) injection, Band-to-Band tunneling (BTBT) induced hot-electron injection, and tunneling ballistic-electron injection.

42. The method of claim 39 further comprising erasing said nonvolatile multilevel memory cell using one of Band-to-Band tunneling (BTBT) induced hot-hole injection, tunneling ballistic-hole injection, and Fowler-Nordheim (FN) tunneling.

43. The method of claim 33 further comprising:
configuring a plurality of said nonvolatile multilevel memory cells in a memory array;
programming a block of said nonvolatile multilevel memory cells in a memory block using a block-level program operation; and
verifying that said nonvolatile multilevel memory cells of said memory block are programmed to said one of said S states using a block-level verify operation.

44. The method of claim 43 further comprising erasing said nonvolatile multilevel memory cells of said memory block using a page-level erase operation.

* * * * *